United States Patent
Sanduleanu et al.

(10) Patent No.: US 7,720,188 B2
(45) Date of Patent: May 18, 2010

(54) FAST PHASE-FREQUENCY DETECTOR ARRANGEMENT

(75) Inventors: Mihai Adrian Tiberiu Sanduleanu, Eindhoven (NL); Eduard Ferdinand Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 736 days.

(21) Appl. No.: 10/599,326

(22) PCT Filed: Mar. 16, 2005

(86) PCT No.: PCT/IB2005/050924

§ 371 (c)(1),
(2), (4) Date: Sep. 26, 2006

(87) PCT Pub. No.: WO2005/093955

PCT Pub. Date: Oct. 6, 2005

(65) Prior Publication Data

US 2008/0238489 A1    Oct. 2, 2008

(30) Foreign Application Priority Data

Mar. 29, 2004  (EP) .................................. 04101278

(51) Int. Cl.
*H03D 3/24*  (2006.01)
(52) U.S. Cl. .................. 375/374; 327/157; 327/536
(58) Field of Classification Search ............... 375/374; 327/148, 157, 536; 257/299
See application file for complete search history.

(56) References Cited

U.S. PATENT DOCUMENTS

| 5,087,841 | A | 2/1992 | Rogers | |
|---|---|---|---|---|
| 5,736,880 | A * | 4/1998 | Bruccoleri et al. | .......... 327/157 |
| 5,736,892 | A | 4/1998 | Lee | |
| 6,055,286 | A | 4/2000 | Wu et al. | |
| 6,081,572 | A | 6/2000 | Filip et al. | |
| 6,411,665 | B1 | 6/2002 | Chan et al. | |
| 6,466,070 | B1 * | 10/2002 | Ross | .......... 327/157 |
| 6,480,069 | B2 * | 11/2002 | Yasukouchi | .......... 330/288 |

(Continued)

FOREIGN PATENT DOCUMENTS

DE          19630917 C1       3/1998

(Continued)

OTHER PUBLICATIONS

Robert R. Cordell, et al: A 50 MHz Phase and Frequency Locked Loop, vol. SC-14, No. 6, Dec. 1979 IEEE.

(Continued)

*Primary Examiner*—Jean B Corrielus

(57) ABSTRACT

The present invention relates to a detector arrangement and a charge pump circuit for a recovery circuit recovering timing information for random data. The detector arrangement comprises a first latch circuit for sampling a quadrature component of a reference signal based on an input signal, to generate a first binary signal, a second latch circuit for sampling an in-phase component of the reference signal based on the input signal, to generate a second binary signal, and a third latch circuit for sampling the first binary signal based on the second binary signal, to generate a frequency error signal. Furthermore, the charge pump circuit comprises a differential input circuit and a control circuit for controlling a tail current of the differential input circuit in response to a frequency-locked state of frequency detector arrangement.

4 Claims, 21 Drawing Sheets

U.S. PATENT DOCUMENTS

| | | | |
|---|---|---|---|
| 6,515,536 B2* | 2/2003 | Liang et al. | 327/537 |
| 6,522,206 B1* | 2/2003 | Kornblum et al. | 331/1 A |
| 6,624,674 B1* | 9/2003 | Zhao | 327/156 |
| 6,894,570 B2* | 5/2005 | Liang | 331/17 |
| 7,049,898 B2* | 5/2006 | Banerjee et al. | 331/108 C |
| 7,397,316 B2* | 7/2008 | Chae et al. | 331/57 |
| 7,466,174 B2* | 12/2008 | Tirumalai et al. | 327/156 |
| 2001/0052807 A1* | 12/2001 | Vaucher | 327/157 |
| 2003/0016057 A1 | 1/2003 | Donnelly et al. | |
| 2003/0034813 A1* | 2/2003 | Sanduleanu | 327/157 |
| 2003/0231037 A1* | 12/2003 | Lee et al. | 327/157 |
| 2004/0041603 A1* | 3/2004 | Abidin et al. | 327/157 |
| 2005/0083090 A1* | 4/2005 | Moraveji | 327/157 |

FOREIGN PATENT DOCUMENTS

| | | |
|---|---|---|
| EP | 0 289 941 A2 | 11/1988 |

OTHER PUBLICATIONS

Ansgar Pottbacker, et al: A Gb/s Si Bipolar Phase and Frequency Detector IC for Clock Extraction, ISSCC, pp. 162-163, Feb. 1992, IEEE.

Behzad Razavi, et al: A 2.5-Gb/sec 15-mW BiCMOS Clock Recovery Circuit, Symposium on VLSI Circuit Dig. of Tech. pp. 83-85, 1995.

Hans Ransijn, et al: A PLL-Based 2.5-GaAs Clock and Data Regentrator IC, vol. 26, No. 10, pp. 1345-1353, Oct. 1991. IEEE.

* cited by examiner

FAST PHASE-FREQUENCY DETECTOR ARRANGEMENT

The present invention relates to a detector arrangement for detecting a frequency error between an input signal and a reference signal, and to a charge pump circuit for use in such frequency detector arrangement. Furthermore, the present invention relates to a frequency error detection method and a charge pump controlling method and to a recovery circuit comprising the detector arrangement and the charge pump circuit, for recovering timing information from random data.

In recent years there has been a significant research effort in the area of high-speed electronics for communication. In order to take full advantage of the broadband capabilities of optical fibers, there is need of high-speed electronic building blocks, in particular integrated solutions to reduce costs and improve reliability. Generally, when long distances are involved, regeneration of data is compulsory since data gets distorted due to fiber impairments on signal transfer. Fiber dispersion, a well known fiber impairment translates into pulse width distortion. To guarantee data recovery at reasonable bit-error rate (BER), the signal is typically regenerated after a certain distance (for instance, in SONET about every 500 km; in 10 Gbit Ethernet, about every 10 to 40 km) to prevent degradation of the signal-to-noise ratio (SNR). The regeneration is typically performed in an optical transceiver.

Figure 1:
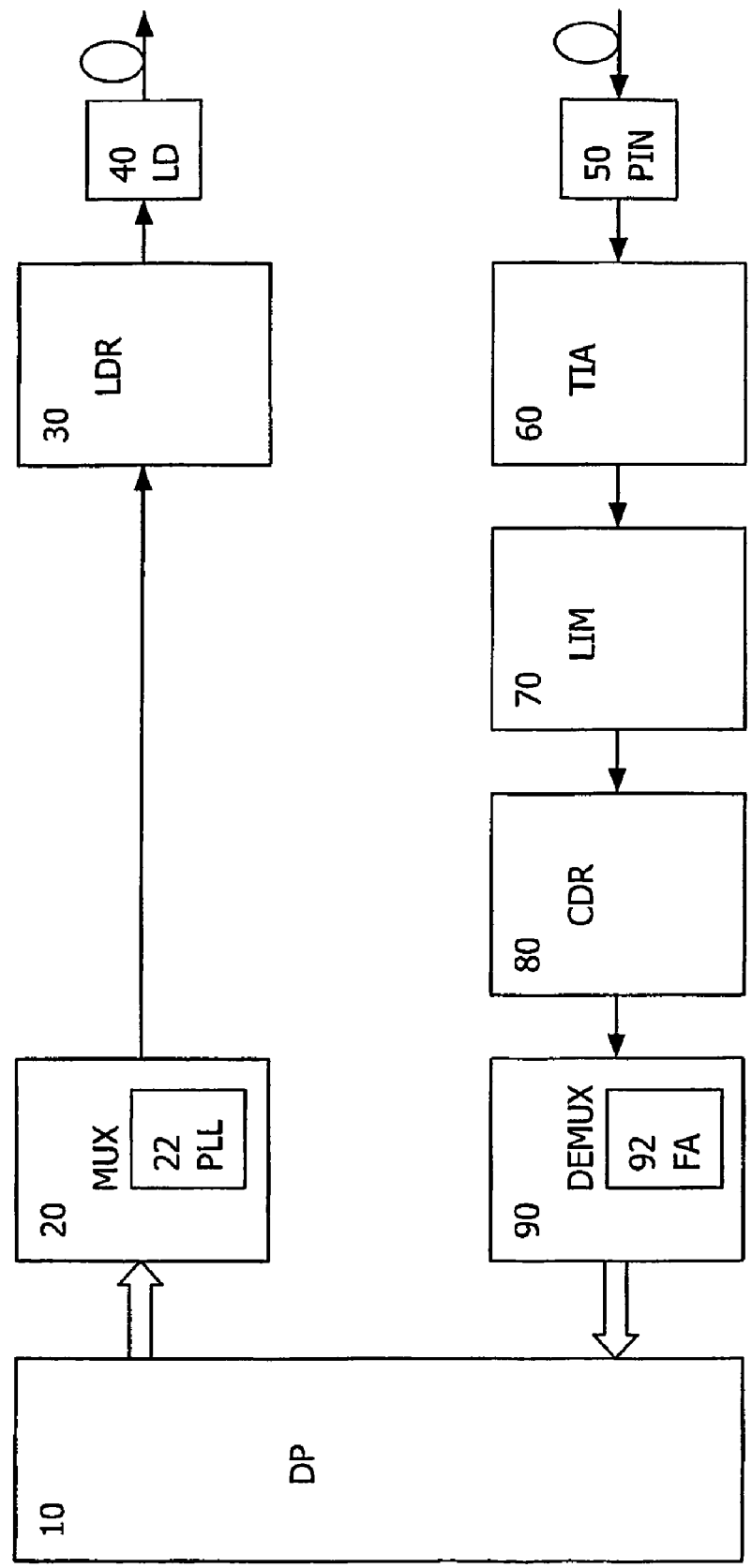

FIG. 1 shows a schematic block diagram of an architecture of an optical transceiver. The receiving and transmitting blocks are composed of several analog and digital integrated circuits. At the receiver side, optical signals are converted into electrical signals, data signals are regenerated and, finally, a serial to parallel converter demultiplexes the retimed serial signal to a lower rate, at which it can be processed by digital circuitry, such as a CMOS (Complementary Metal Oxide Semiconductor) circuitry. At the transmitter side, a parallel to serial converter, where a PLL (Phase Locked Loop) circuitry generates a low jitter clock for retiming of the NRZ (Non Return to Zero) data stream, multiplexes the parallel data to a high rate serial data, and finally the serial data signal can be converted back into optical pulses. In general, the term "jitter" is used here to indicate any kind of random and/or undesired phase variation.

The data transmitted over the optical fibers is encoded in NRZ format, which implies that no information of the clock signal can be extracted directly from the stream due to the fact that the signal does not return to zero level after each positive or negative bit value. When long data sequences without transition occur, synchronisation at the receiver end becomes very difficult. This is due to the properties of NRZ data which spectrum has nulls at frequencies that are integer multiples of the bit rate. For this reason, a nonlinear circuit is needed to recover the clock spectral component from the bit stream.

According to FIG. 1, the transmitting end receives data from a data processor 10 and generates a serial data stream at a multiplexer 20 using a PLL circuit 22. The data stream is supplied to a laser driver 30, which drives a laser device 40 so as to couple an optical signal into an optical fiber. The function of the optical receiver is the detection of the incoming optical NRZ signal and the regeneration or recovery of the transmitted data. The combination of a photo detector 50, and a subsequent transimpedance amplifier 60 is known as the "front end" portion. The photo detector 50 may be a PIN photodiode or an avalanche photo detector, which convert the optical signals received via the optical fiber into electrical signals. The low level signal generated by the photo detector 50 is amplified by the transimpedance amplifier 60, which may be a low-noise preamplifier, followed by a limiting amplifier 70 with automatic gain control. A clock extraction and data regeneration circuit (DCR or CDR) 80 recovers the timing information from the random data and samples the data stream at an appropriate instant or timing. Finally, a serial to parallel converter or demultiplexer 90 demultiplexes the retimed serial data to a lower rate, where it can be processed by the digital circuitry of the data processor 10. In the demultiplexer 90, a frame alignment unit 92 may be arranged for synchronization purposes. In order to perform synchronous operations such as retiming and demultiplexing of random data, high-speed receivers must generate a clock. To achieve this, a clock recovery circuit senses the data and produces a periodic clock. Data can be retimed in a D-flip-flop or D-latch by the recovered clock, i.e. it samples the noisy data, yielding an output with less jitter. Such a flip-flop or latch circuit is sometimes called decision circuit. The recovered clock should preferably have a frequency equal to the data rate, so that, for example, a data rate of 10 Gb/s translates to a clock frequency of 10 GHz with a period of 100 ps. Furthermore, the recovered clock should bear a certain phase relationship with respect to the data, allowing optimum sampling of the bits by the clock. If the rising edges of the clock coincide with the midpoint of each bit, the sampling occurs farthest from the preceding and following data transitions, providing maximum margin for jitter and other timing uncertainties. Finally, the recovered clock should exhibit a small jitter since it is the main contributor to the retimed data jitter. To generate the clock wave form, a voltage controlled oscillator (VCO) is employed which is phase-locked to the input data using e.g. a flip-flop or latch circuit operating as a phase detector. A low pass filter suppresses ripple on the oscillator control line. Also, to retime the data, another flip-flop or latch circuit may be added, which is clocked by the VCO output. Hence, the recovered clock drives the input of the phase detector and the clock input of the retimer.

Figure 24:
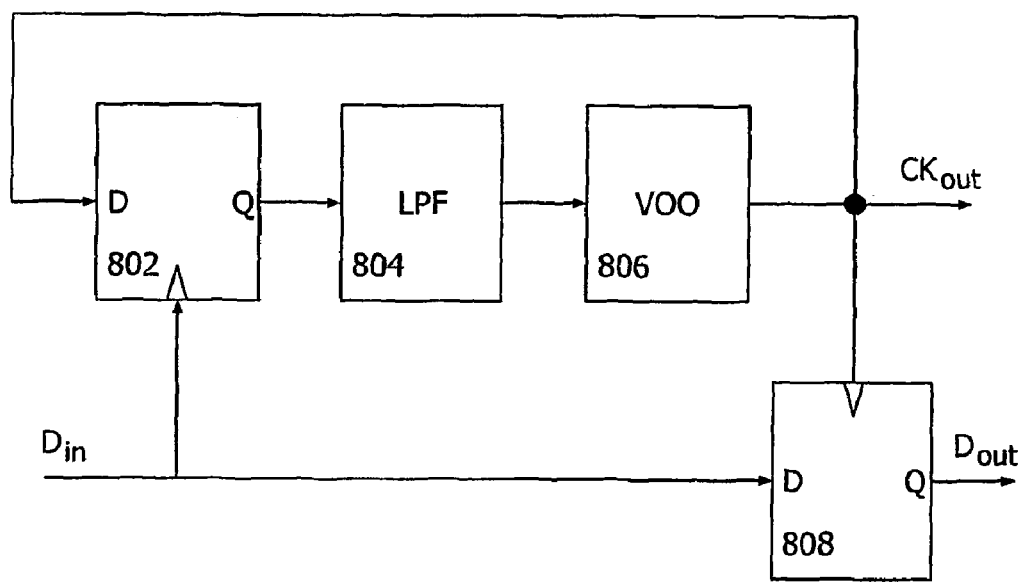

FIG. 24 shows a schematic block diagram of a conventional implementation of the CDR circuit in FIG. 1. According to FIG. 24, input data $D_{in}$ is supplied as a clock signal to a first D-flip-flop or latch circuit 802 which operates as a phase detector, and to a second D-flip-flop or latch circuit 808 which operates as a retimer circuit and generates the recovered output data $D_{out}$. The output of the first D-flip-flop 802 is supplied via a low pass filter 804 to a VCO 806 which generates a recovered clock signal $CK_{out}$. The recovered clock $CK_{out}$ is supplied as input signal to the first flip-flop circuit 802 and as clock signal to the second flip-flop circuit 808. This known CDR circuit operates as follows. Upon turn-on, the first flip-flop circuit 802 multiplies the edge-detected input data $D_{in}$ by the output clock of the VCO 806, generating a beat that drives the VCO frequency towards the input bit rate. If the initial difference between the VCO frequency and the data rate is sufficiently small, the loop locks, establishing a well-defined phase relationship between the input data $D_{in}$ and the recovered output clock $CK_{out}$. In fact, with such a bang-bang characteristic provided by the first flip-flop circuit 802 as phase detector, the data edges settle around the zero-crossing points of the clock. Even for a slight phase error, the first flip-flop circuit 802 generates a large output, driving the loop towards the locking state.

However, the known CDR circuit of FIG. 24 suffers from a number of drawbacks. First, the first flip-flop circuit 802 may produce full digital outputs for run lengths greater than one, thereby creating substantial ripple on the control voltage of the VCO 806 and hence jitter at the output. Second, since the first flip-flop circuit 802 samples the clock by the data, whereas the second flip-flop circuit 808 samples the data by the clock, data retiming exhibits significant phase offset at high speeds. Typically, flip-flops display unequal delays from the D-input to the output and from the clock input to the output. Thus, if for example the CK-to-Q delay is longer than the D-to-Q delay by $\Delta T$, the first flip-flop 802 locks such that the data leads the clock by $\Delta T$, sampling the clock closer to the zero crossing after the data experiences the intrinsic delay of the first flip-flop circuit 802.

The output of the VCO 806 suffers from even more delay as it propagates through the second flip-flop circuit 808, sampling the data far from the middle of the eye generated by superposition of several signal periods. In other words, if the difference between the CK-to-K and D-to-Q delays is equal to $\Delta T$, the retiming suffers from a skew or delay of $2\Delta T$. Third, the simple CDR architecture of FIG. 24 relates to the feedthrough of data to the VCO output through both flip-flop circuits 802, 808. The output phase is disturbed on arrival of each data transmission, requiring that the VCO 806 be followed by a buffer stage providing significant reverse isolation.

In general, CDRs for NRZ data can be grouped into open loop and closed loop circuits. The clock recovery circuits limit the obtainable data rate of multi-gigabit-per-second integrated fiber optic receivers. It is by far the most complicated building block of the transceiver and the most difficult to design.

Figure 25:
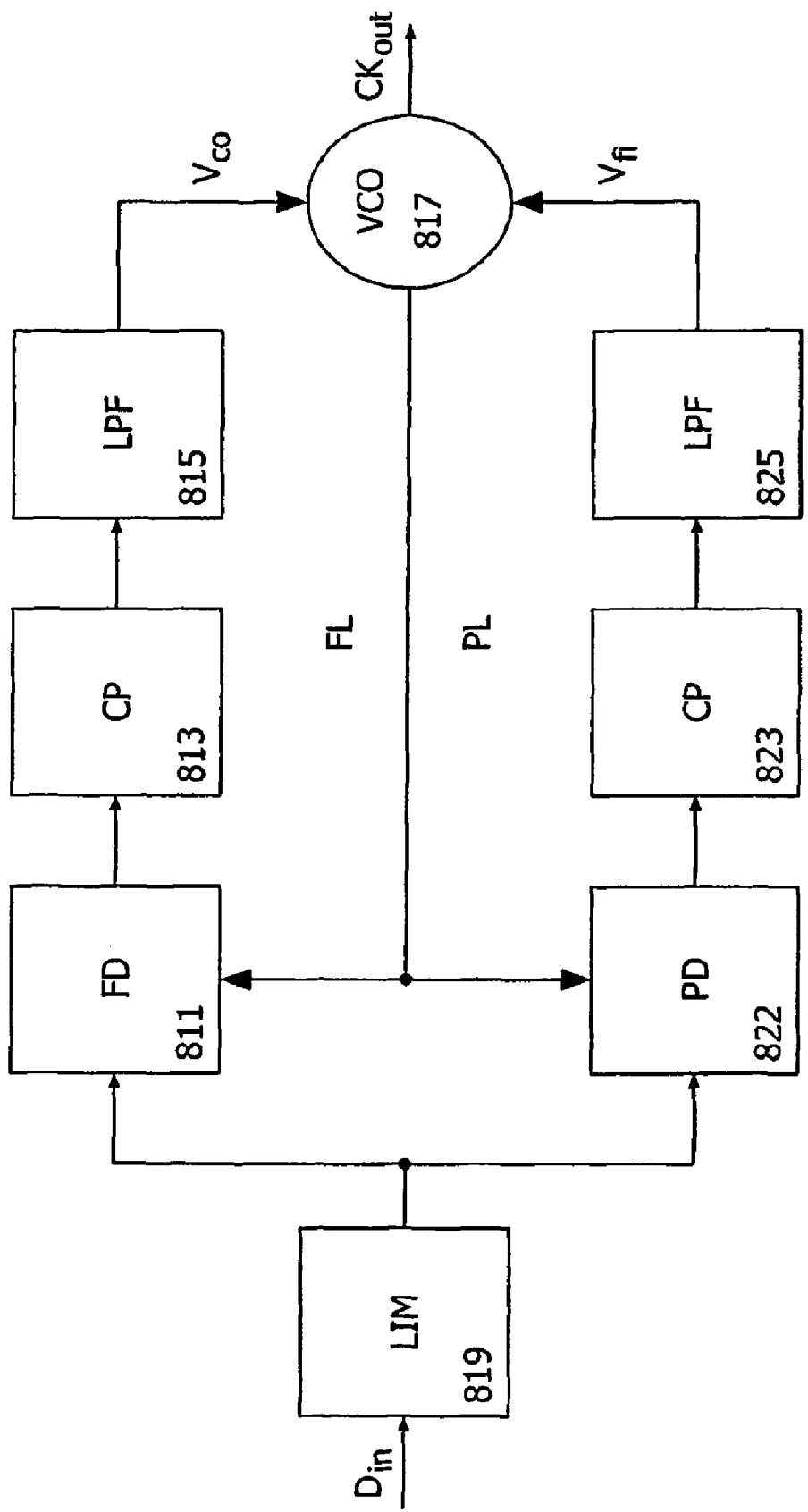

FIG. 25 shows a schematic block diagram of a conventional CDR circuit with two separate loops and autonomous frequency locking on the random input data $D_{in}$. The presence of the two loops provides the possibility to dimension the loops in different ways and to achieve the specifications by decoupling the two opposite requirements of CDRs, i.e. fast frequency acquisition and low jitter in the locked state. The frequency loop (FL) is dimensioned for fast frequency acquisition while the phase loop (PL) is dimensioned for the lowest possible jitter peaking. When data transitions are present, a frequency detector 811 acquires the correct frequency and gives a zero DC signal as coarse signal $V_{CO}$ to a coarse input of a VCO 817, which generates the recovered clock signal $CK_{out}$ which is also fed back to the frequency detector 817 and to a phase detector 822 of the phase loop. The phase error signal is supplied as fine signal $V_{fi}$ to a fine input of the VCO 817 via similar charge pump and low-pass filter circuits 823, 825. The random input data $D_{in}$ is supplied to the frequency detector 811 and to the phase detector 822 via a limiter circuit 819 which provides a limiting operation to the amplitude of the random input data. The phase detector 822 may be a bang-bang phase detector.

With the coarse-fine-loop idea, the fine loop is for the phase and the other coarse loop is for the frequency. When the frequency difference is large, the phase loop can be considered open since its gain is very small. The frequency loop gain can be increased independent from the jitter so that the pull-in range can be increased without increase of the jitter. However, a problem arises from the fact that the two loops are always active. Due to this, the frequency detector 811 may add extra jitter after the frequency-locked state has been reached.

Phase detectors and frequency detectors for random high-speed NRZ data have the difficult task to work on random transitions of the data Between transitions, the phase and frequency detection should keep the phase and frequency information such that the VCO is not pulled away from the locked state when transitions are missing. Although, in the known solutions for digital implementations of frequency detectors, an almost zero DC input can be derived in the locked state by using low-pass filters, the bang-bang nature of the frequency detectors enhances the jitter generated by the VCO, making them impractical for low-jitter systems.

It is therefore an object of the present invention to provide an improved detector circuit, which can be used in low-jitter systems operating at high frequencies.

This object is achieved by a detector arrangement for detecting a frequency error between an input signal and a reference signal that includes first latch means for sampling a quadrature component of the reference signal based on the input signal to generate a first binary signal, second latch means for sampling an in-phase component of the reference signal based on the input signal to generate a second binary signal, and third latch means for sampling the first binary signal based on the second binary signal to generate a frequency error signal. This object may also be achieved by a charge pump circuit for use in a frequency detector arrangement that includes a differential input circuit having first and second differential branches, modulating means for modulating first and second current sources respectively arranged in the first and second differential branches, and control means for controlling a tail current of the differential input circuit in response to a frequency-locked state of the frequency detector arrangement. This object may also be achieved by a method of detecting a frequency error between an input signal and a reference signal that includes the steps of sampling a quadrature component of the reference signal based on the input signal to generate a first binary signal, sampling an in-phase component of the reference signal based on the input signal to generate a second binary signal, and sampling the first binary signal based on the second binary signal to generate a frequency error signal. This object may also be achieved by a method of controlling a charge pump circuit used in a frequency detection arrangement that includes the steps of modulating first and second current sources respectively arranged in first and second differential branches of a differential input circuit of the charge pump circuit and controlling a tail current of the differential input circuit in response to a frequency-locked state of the frequency detector arrangement.

Accordingly, the claimed combination of latch means provides transformation of the phase difference between the input signal and the reference signal into positive or negative binary signals. When the signal is positive, the reference signal, e.g. clock signal, will increase its phase, and for negative signals, the reference signal will decrease its phase. The two binary quadrature signals are used in the third latch means in order to produce a frequency error signal. Once the frequency-locked state is acquired, the output of the frequency detector gives a zero DC signal at the output such that the subsequent VCO keeps the frequency information. Due to its simplicity, this principle can be used in high-speed clock and data recovery systems, such as optical communication systems.

Furthermore, the proposed differential charge pump arrangement provides the advantage of being less sensitive to common-mode noise from the power supplying lines and substrate. The principle of controlling the tail current of the charge pump provides the advantage that it will be active only in a frequency error from the detector arrangement needs to be processed. Thus, the charge pump circuit will be switched off completely in the locked state, which leads to a reduced jitter in the recovery system.

Furthermore, control means may be provided in the detector arrangement, for selectively suppressing operation of the charge pump circuit to which the first binary signal is supplied, in response to a control signal derived from the second binary signal.

The first and second latch means of the detector arrangement each may comprise a double-edge triggered flip-flop arrangement. As an example, the double-edged triggered flip-flop arrangement may comprise first and second D-latch circuits receiving the input signal and being respectively controlled by a direct version and an inversed version of the respective component of the reference signal, and a multiplexer circuit being controlled by the inversed version of the respective component. This double-edge detector arrangement is thus clocked on both transitions of the random input data signal, wherein the in-phase component and the quadrature phase component are two full-speed clock signals. The output of the multiplexer circuit can thus be updated only at transitions of the input signal. Before the next data transition arrives, the output of the multiplexer circuit is kept on its previous value. The third latch means may comprise a D-latch circuit receiving the first binary signal and being controlled by the second binary signal. Using such an arrangement, positive to negative transitions of the in-phase vector can be monitored, and a frequency error signal can be generated from the quadrature vector.

The first and second binary signals may be supplied to the charge pump circuit via at least one of respective amplifier and level shifter circuits. In particular, the amplifier circuits each may comprise a combination of a feedback amplifier and a feed forward amplifier. Thereby, signal quality can be improved and the signal swing and/or common mode levels can be adapted to suite the need of the next circuit stage, e.g. the charge pump circuit. The combination of the feedback amplifier and feedforward amplifier provides the advantage of superposition of gain effects, while the output impedance can be reduced and gain can be well controlled by the feedback ratio of the feedback amplifier.

The charge pump circuit may comprise first and second current mirror circuits respectively provided in the first and second differential branches and arranged to copy the modulated current of one differential branch into the respective other differential branch. Thereby, a double output variation can be achieved for each branch due to the fact that the current and modulation is copied into the respective other branch so as to double the output current supplied to a filter of the charge pump circuit.

Furthermore common mode rejection means may be provided for comparing a common-mode voltage at the output of the charge pump circuit with a reference voltage, and for controlling the first and second current sources based on the comparison result. This provides the advantage that the common mode level at the output of the charge pump circuit is constant irrespective of changes in temperature and supply, and an improved stability of the oscillation frequency of the VCO in the recovery loop can be achieved.

The control means of the charge pump circuit may comprise switching means for switching the tail current in response to a control signal indicating the frequency-locked state. Thereby, the tail current can be shut down completely so that there will be no jitter contribution e.g. from the coarse loop in which the charge pump circuit with the respective detector arrangement is used.

Figure 2:
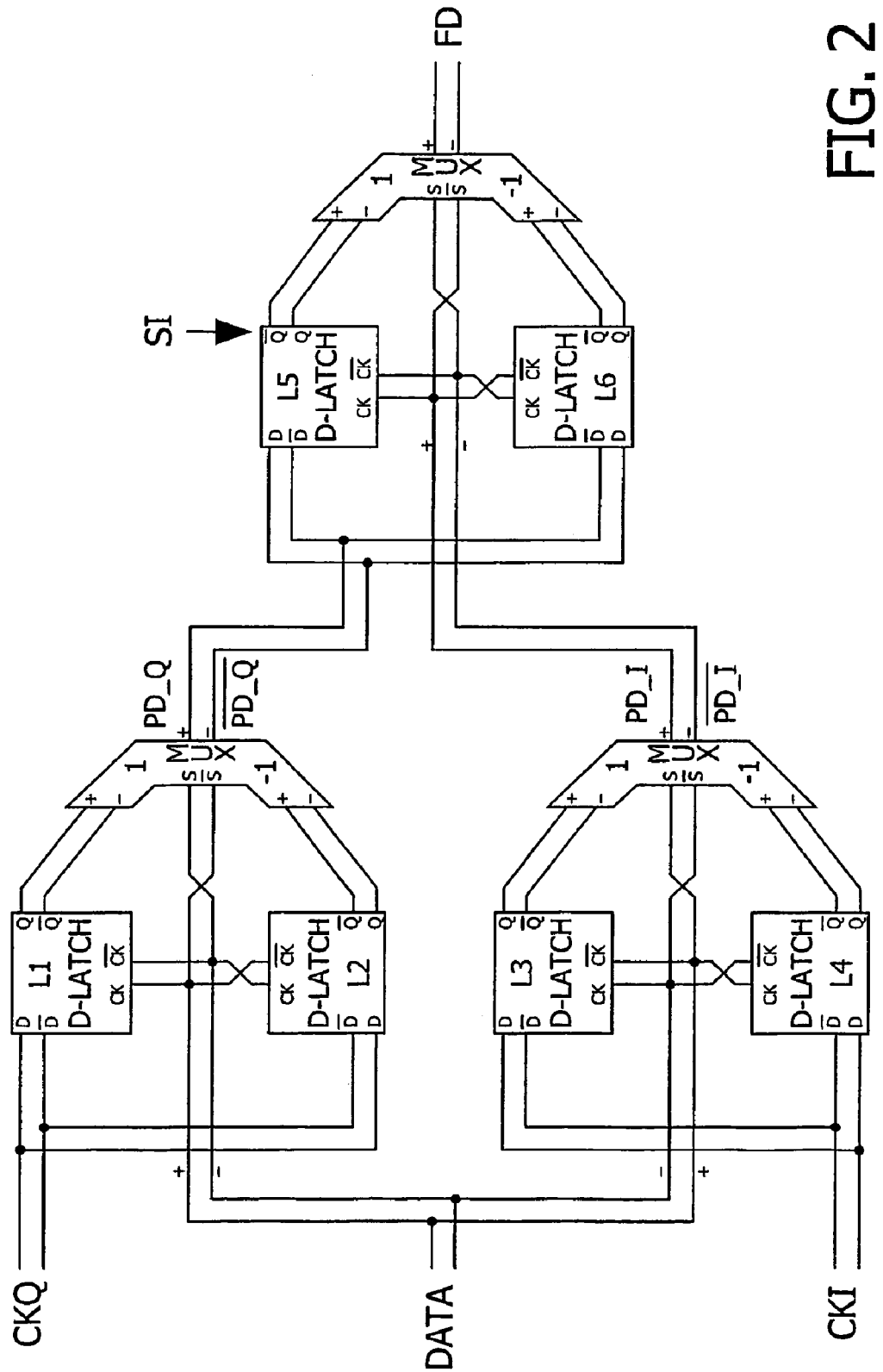
Figure 3:
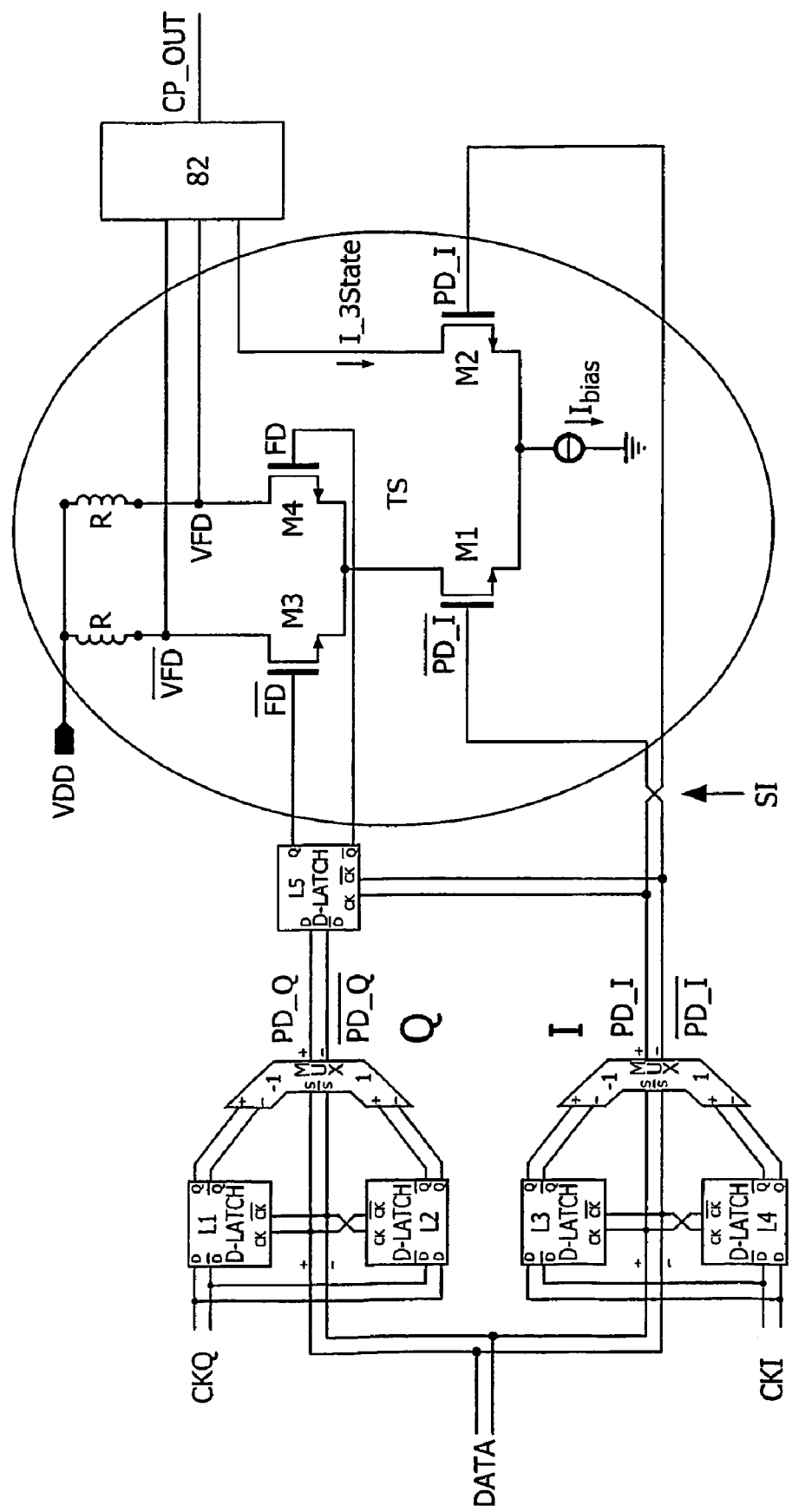
Figure 4A:
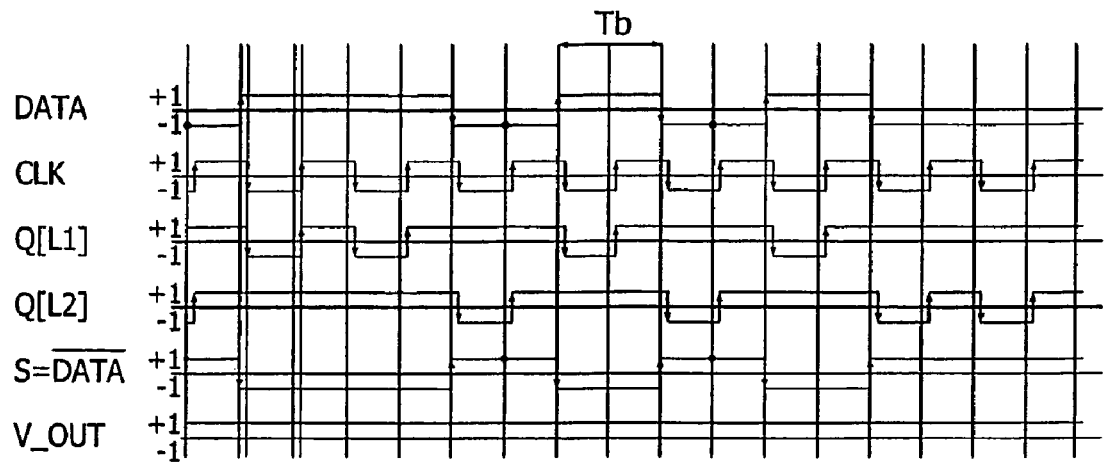
Figure 4B:
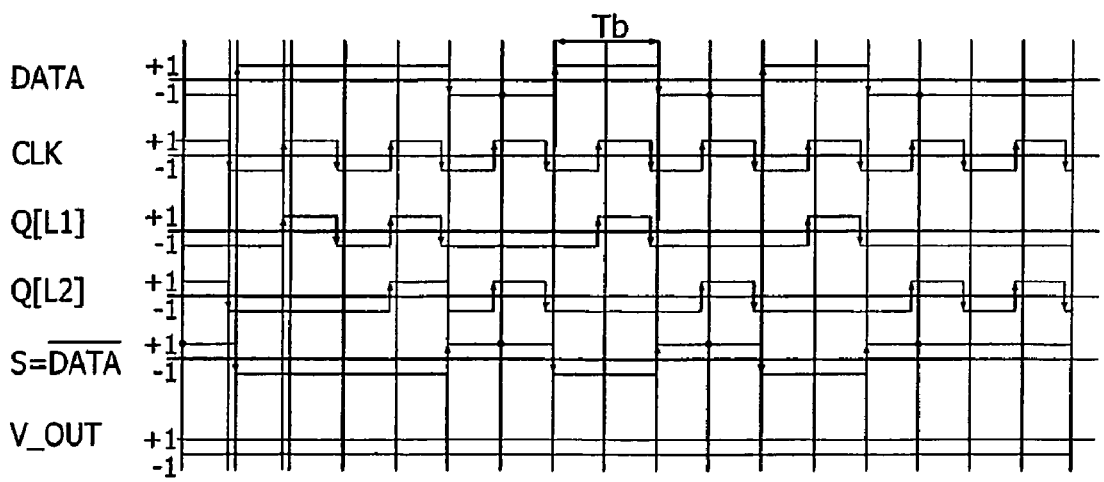
Figure 5:
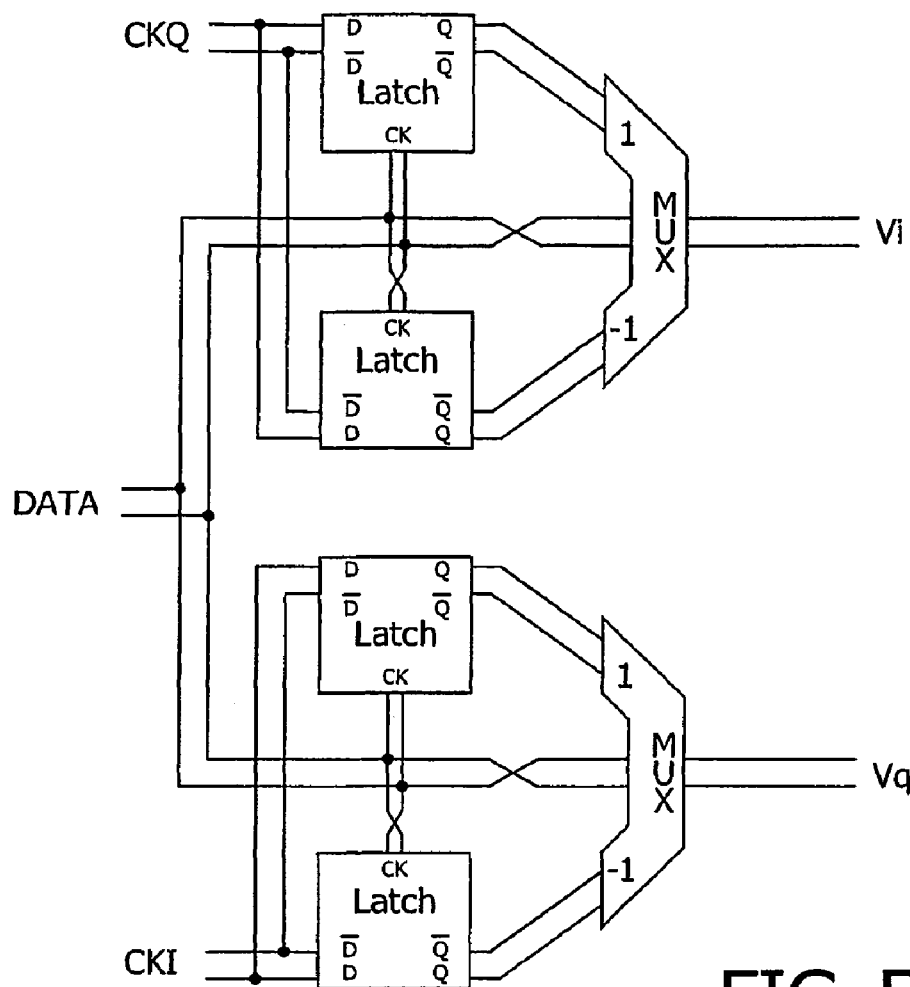
Figure 6:
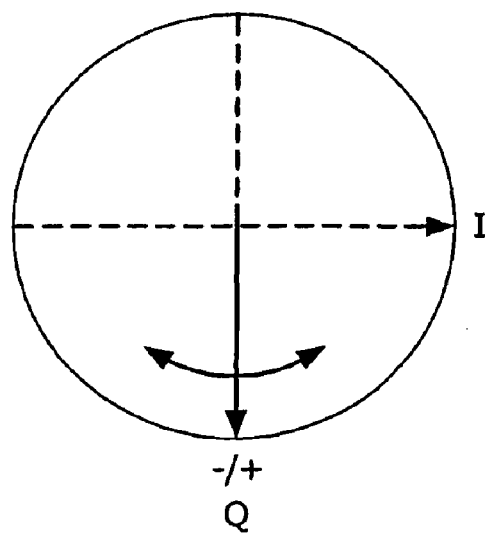
Figure 7:
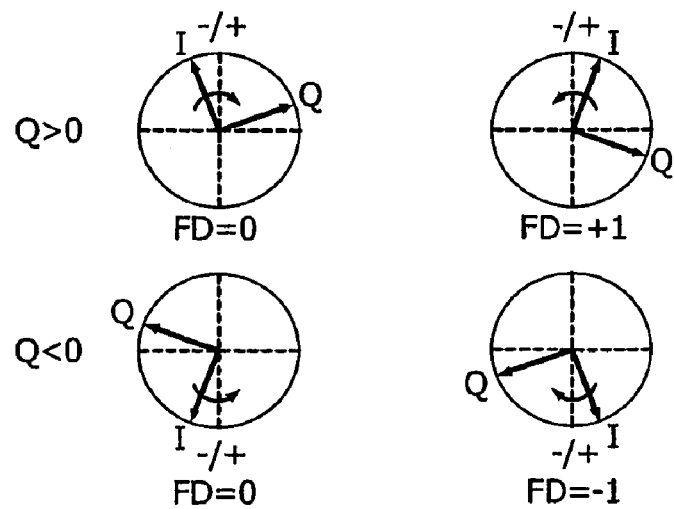
Figure 8:
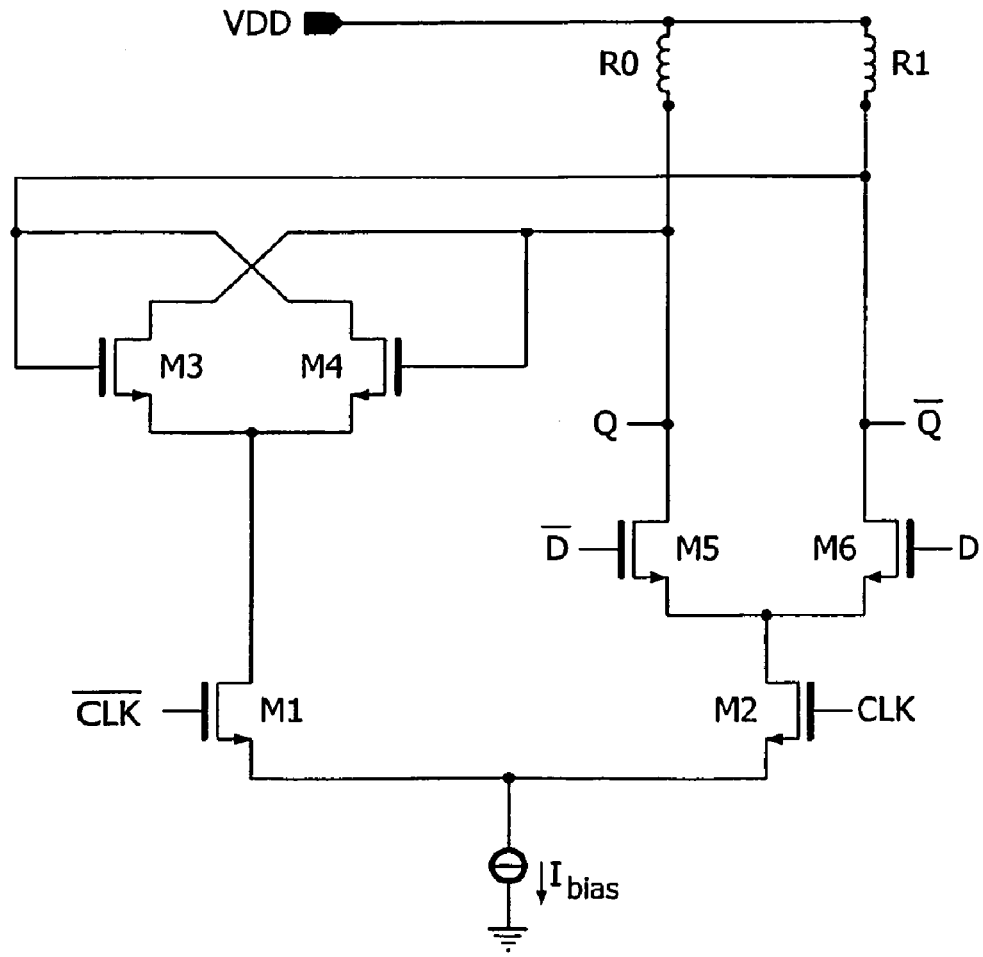
Figure 9:
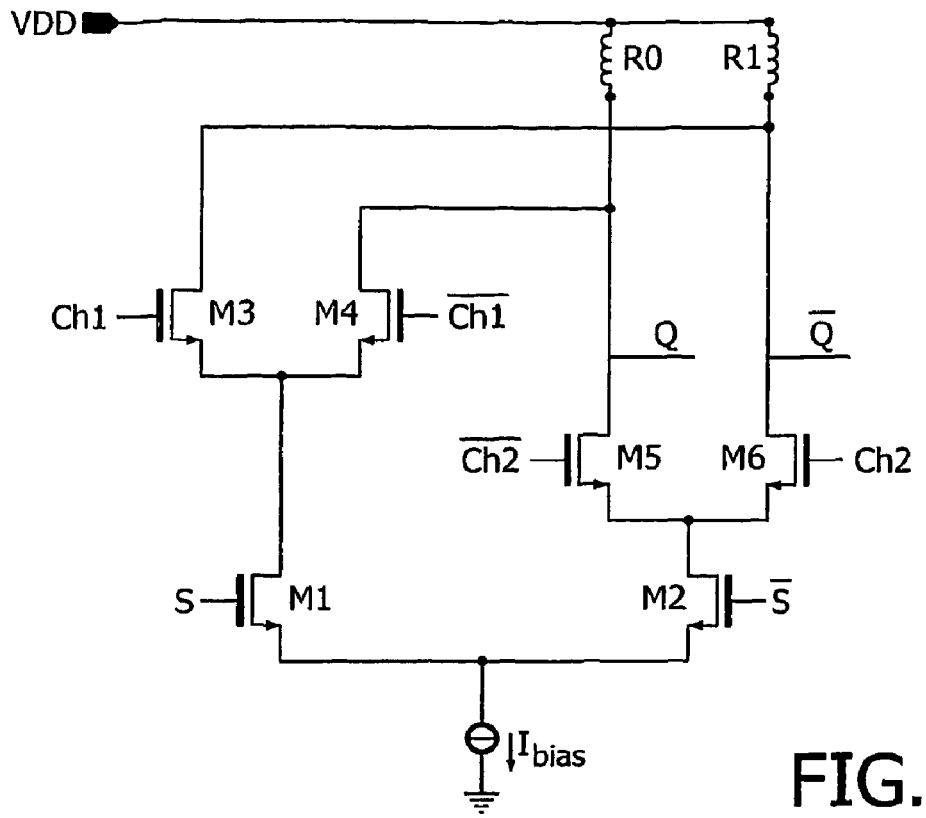
Figure 10:
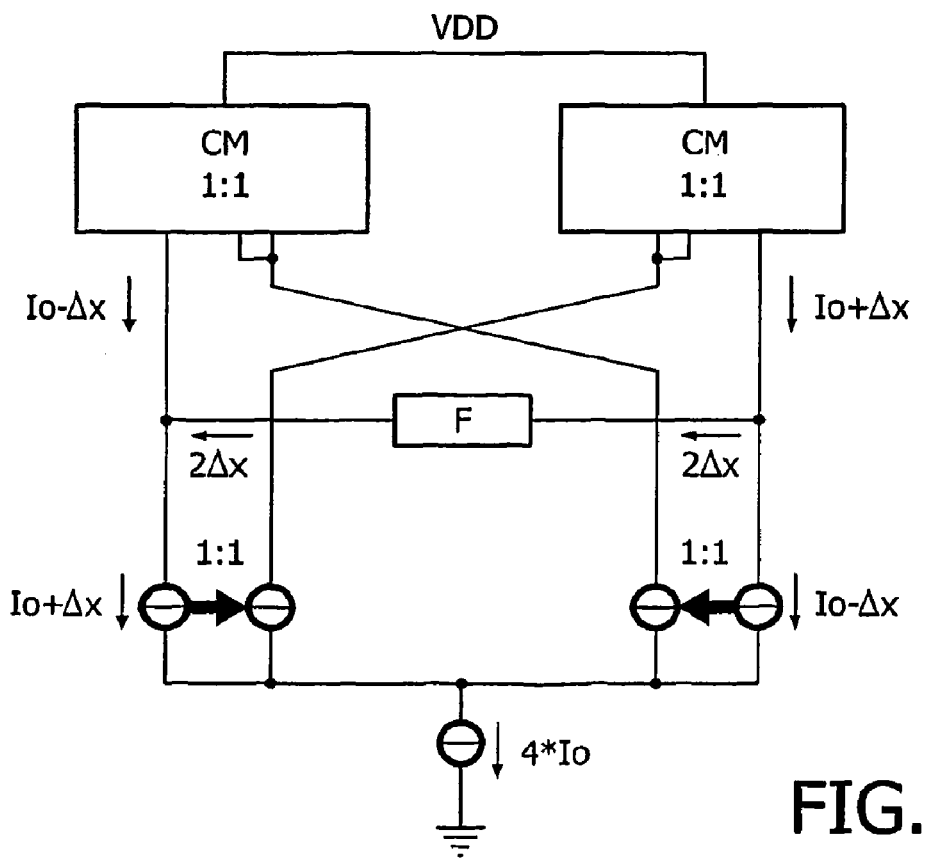
Figure 11:
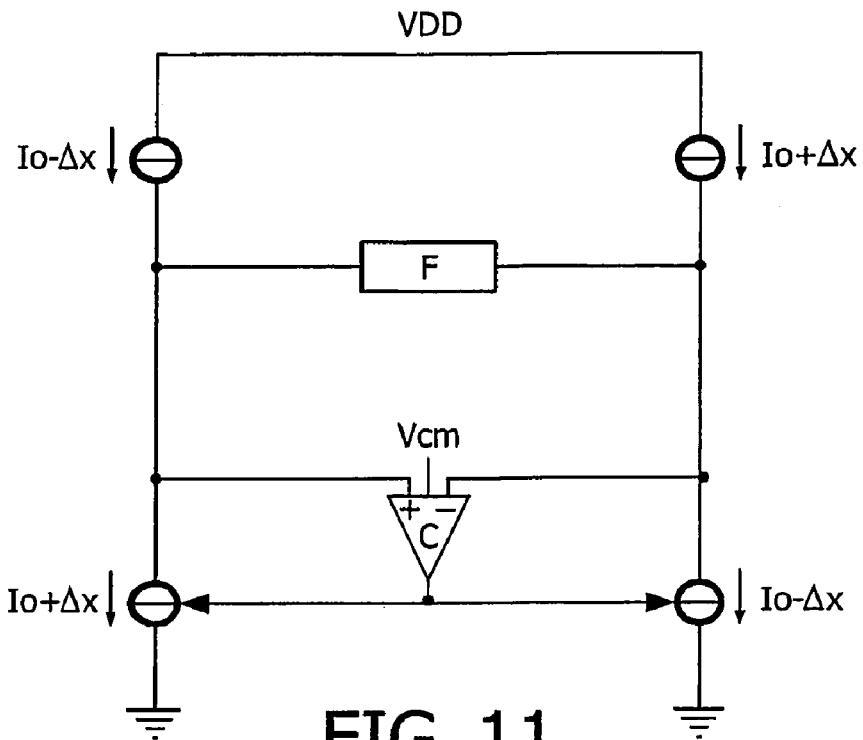
Figure 12:
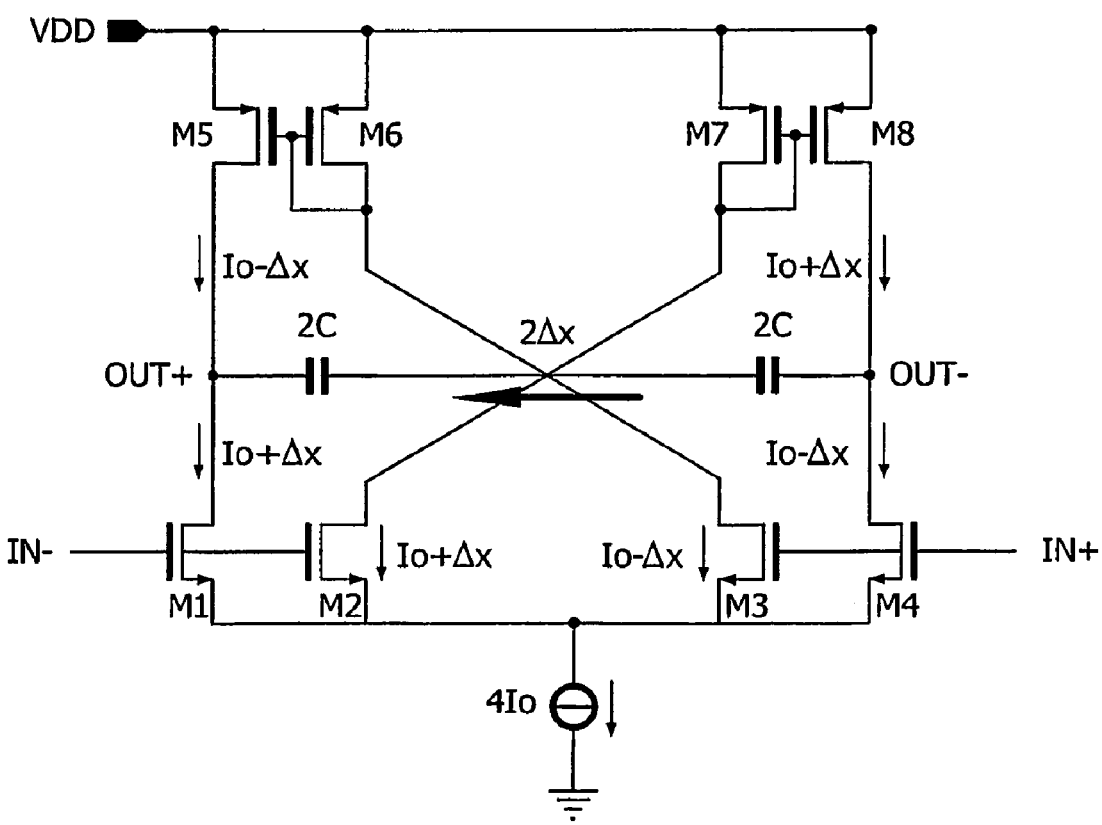
Figure 13:
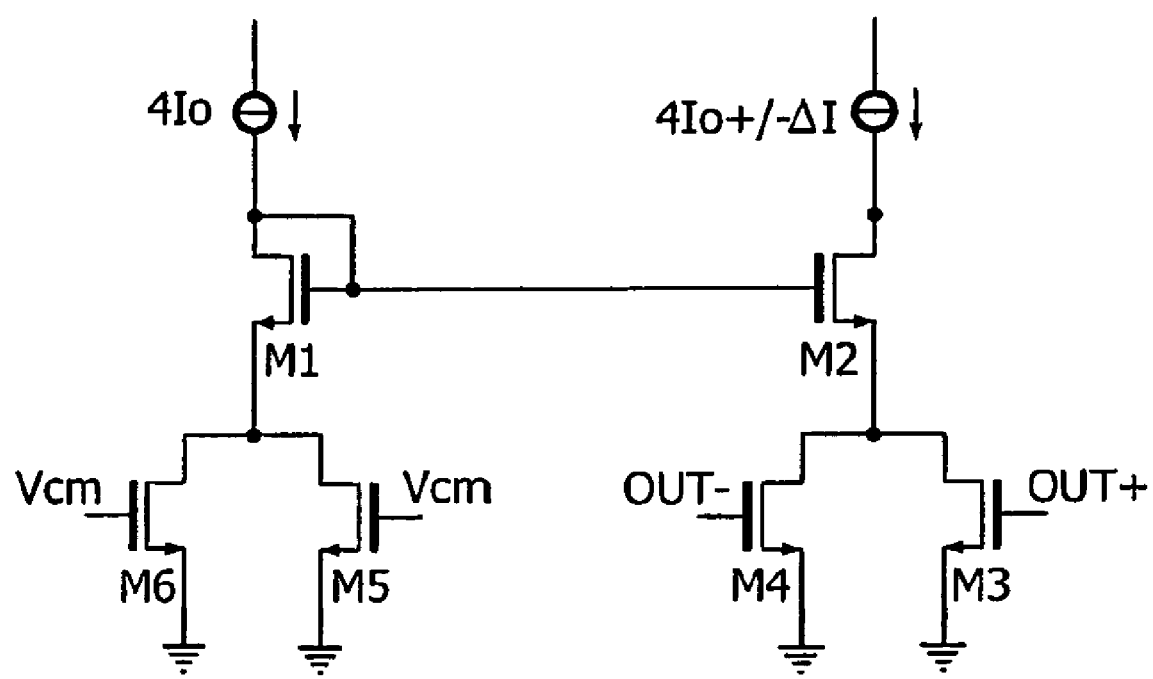
Figure 14:
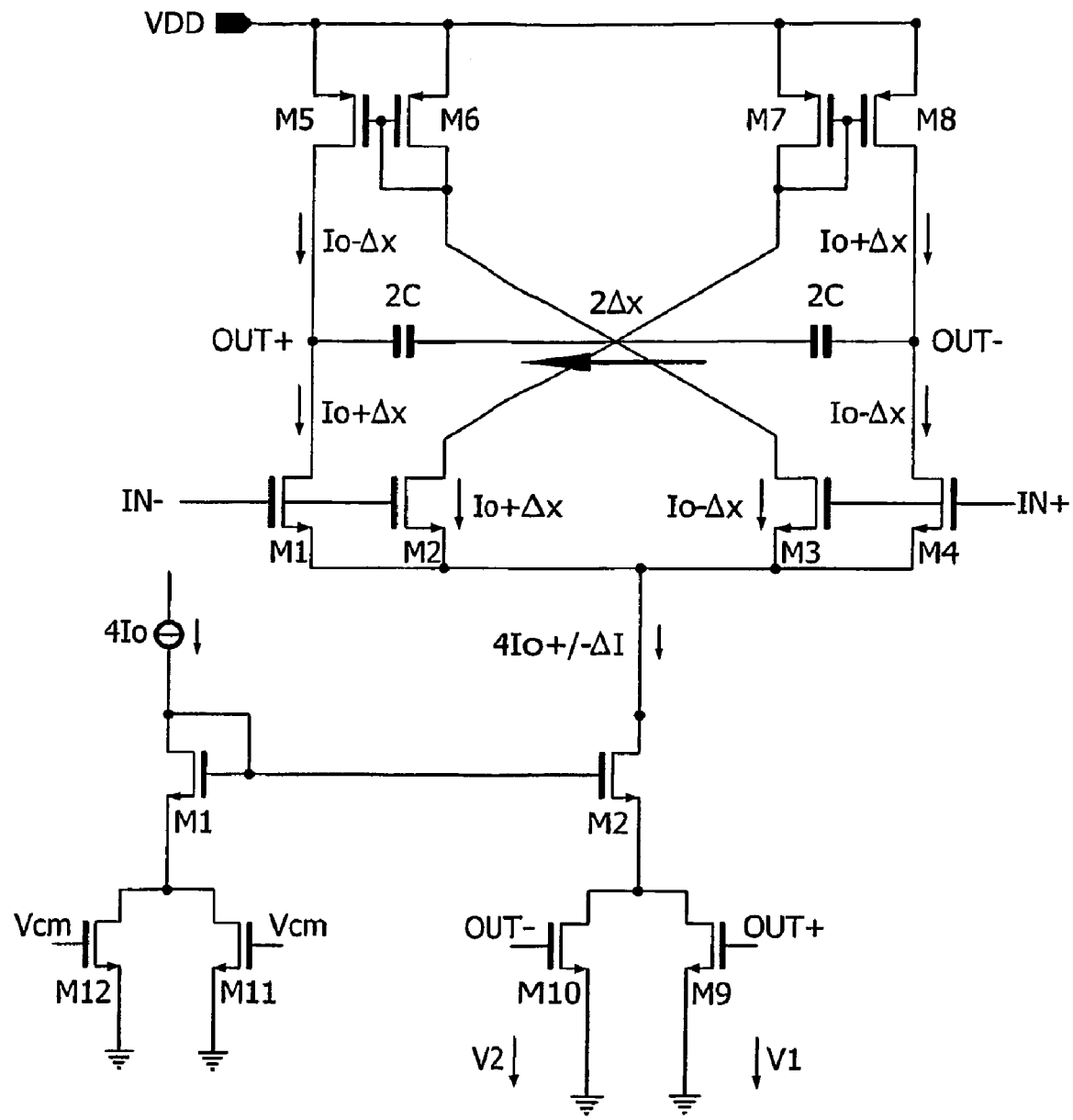
Figure 15:
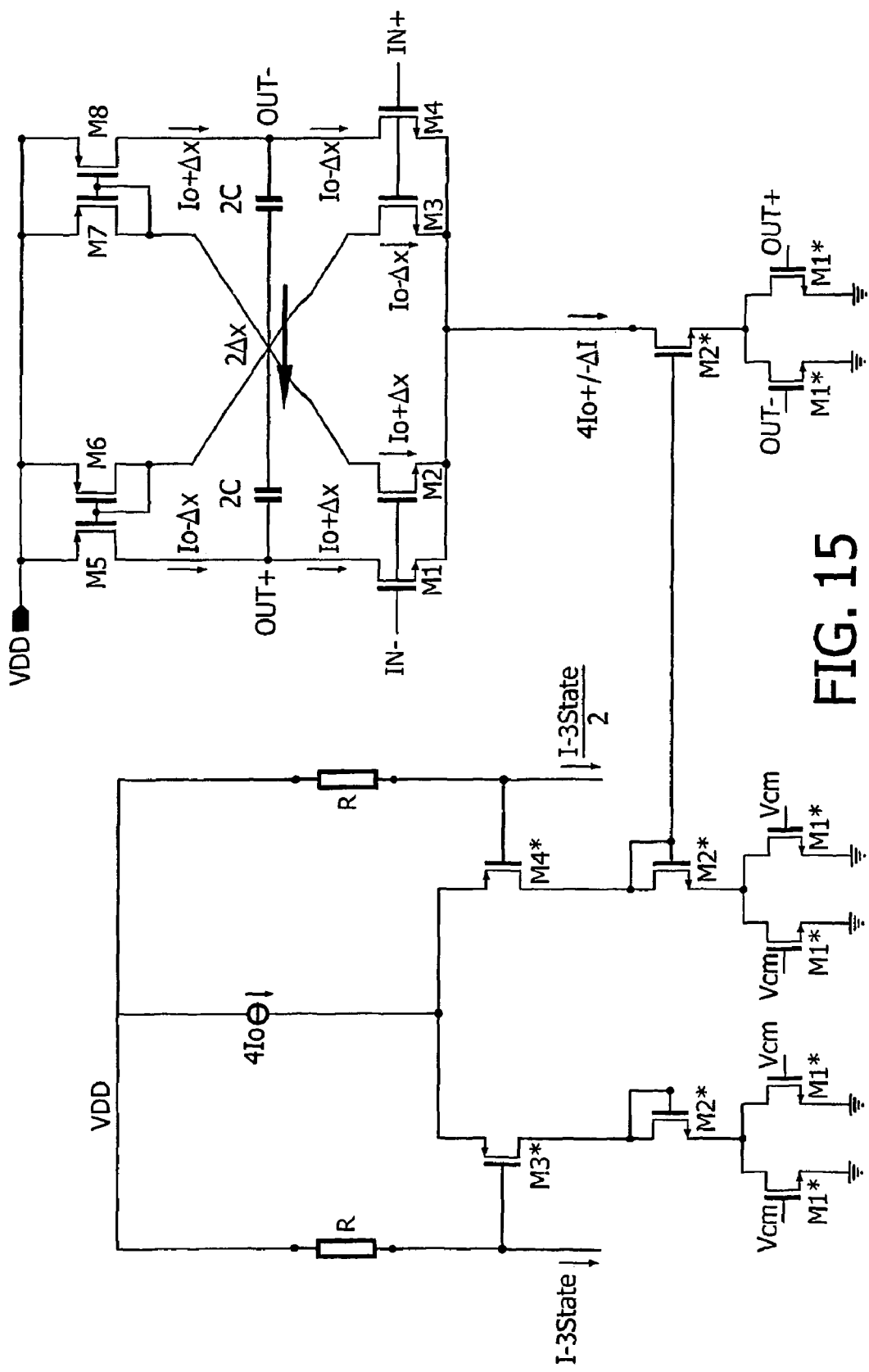
Figure 16:
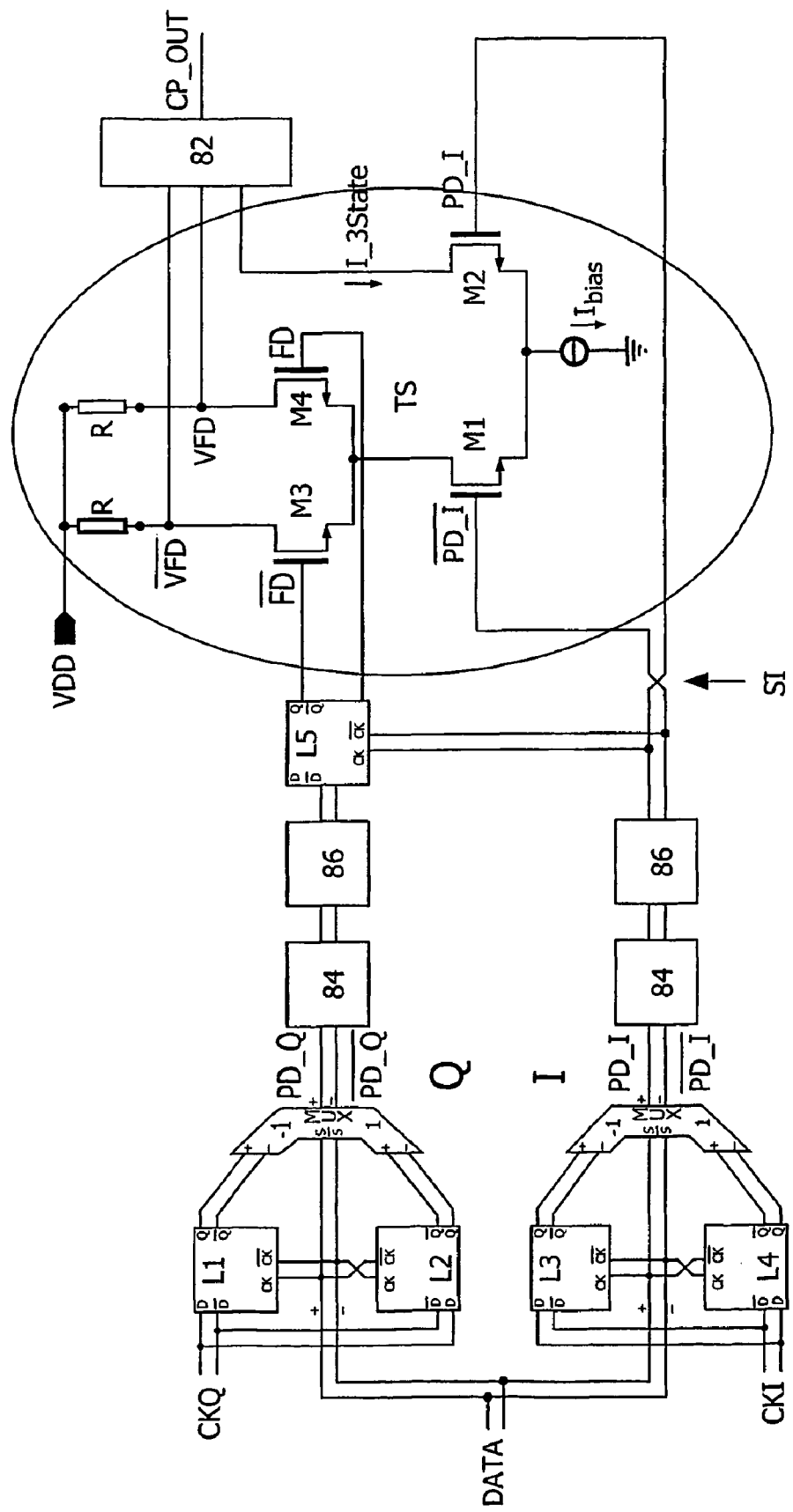
Figure 17:
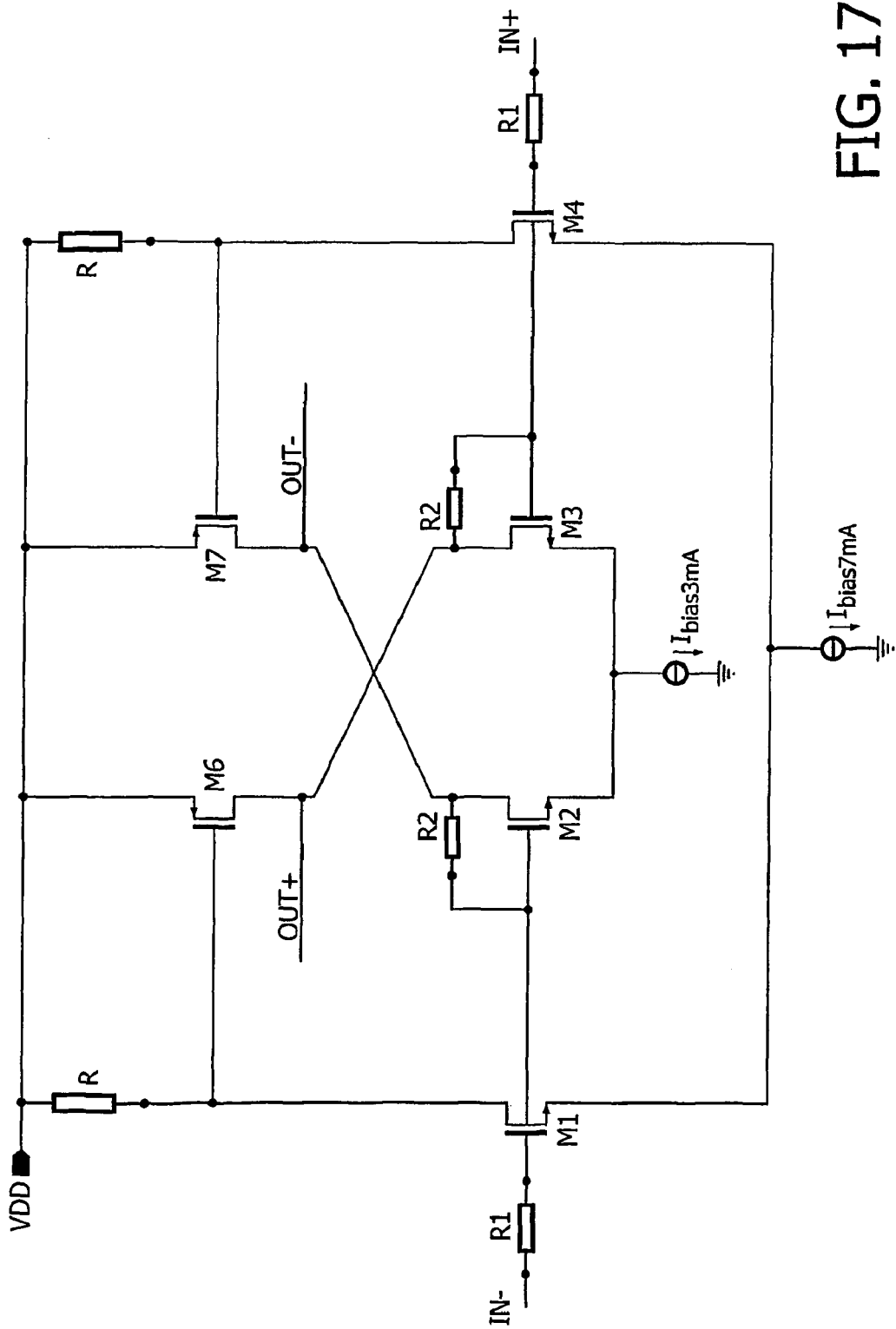
Figure 18A:
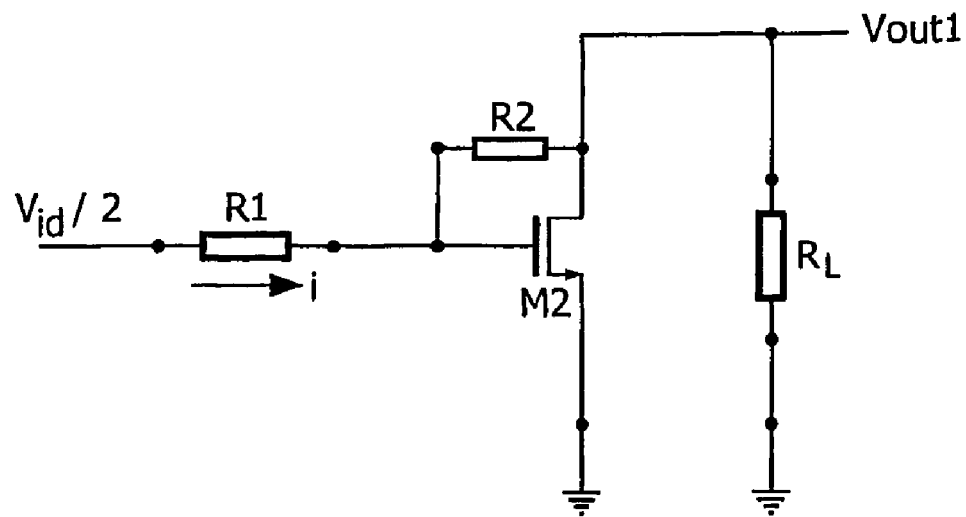
Figure 18B:
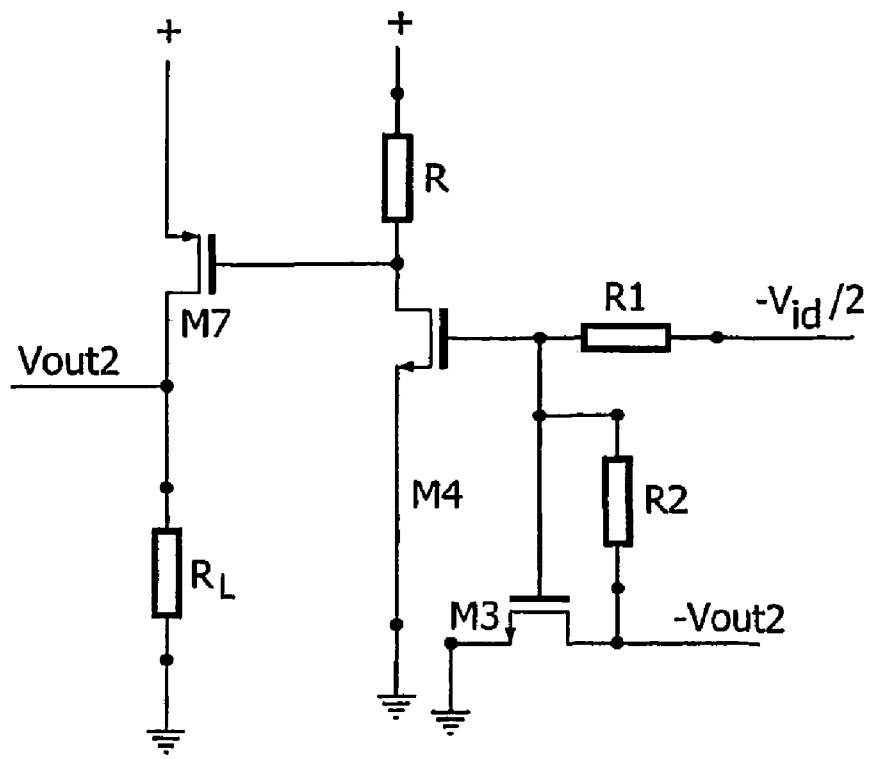
Figure 19A:
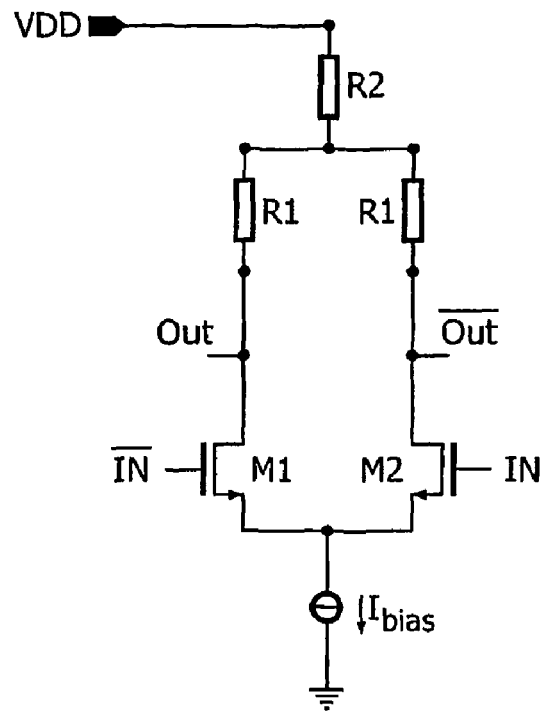
Figure 19B:
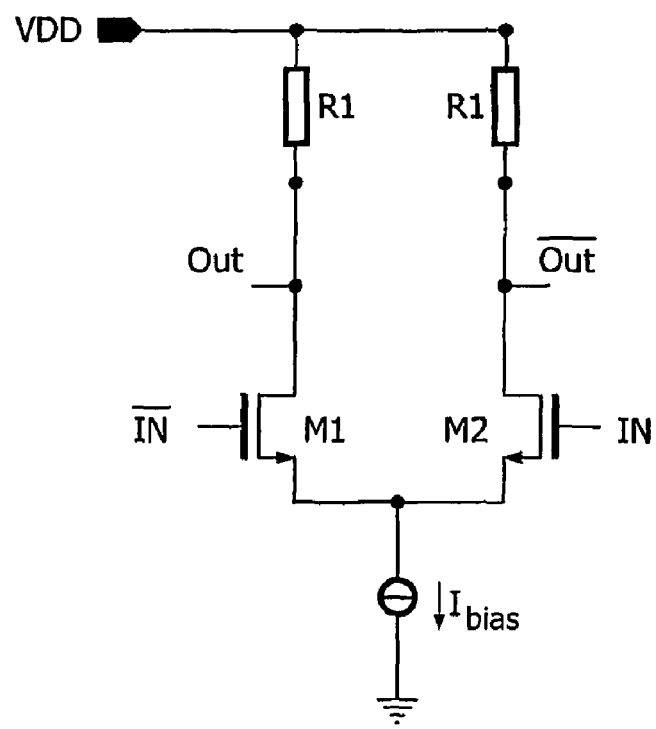
Figure 20:
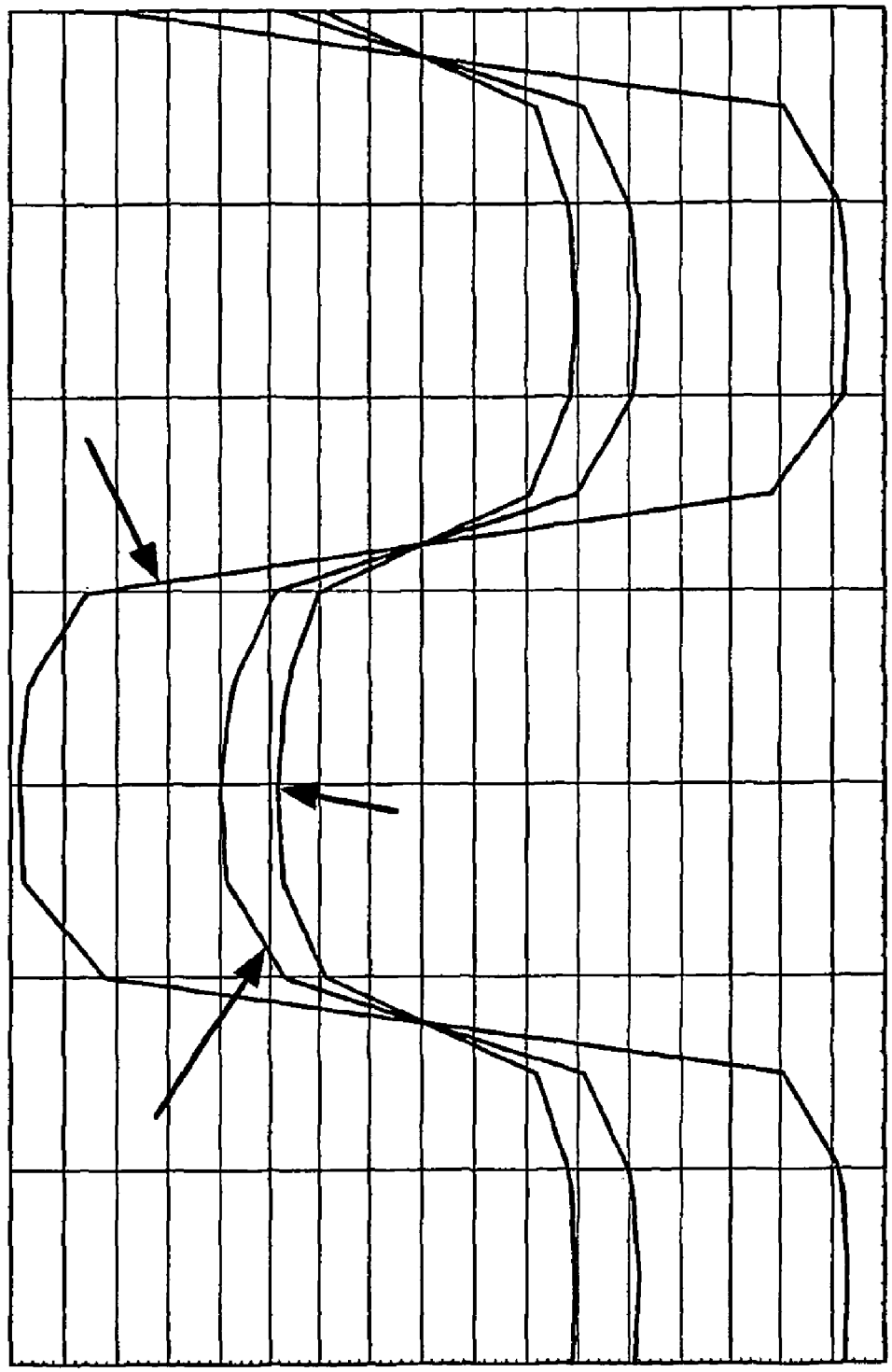
Figure 21:
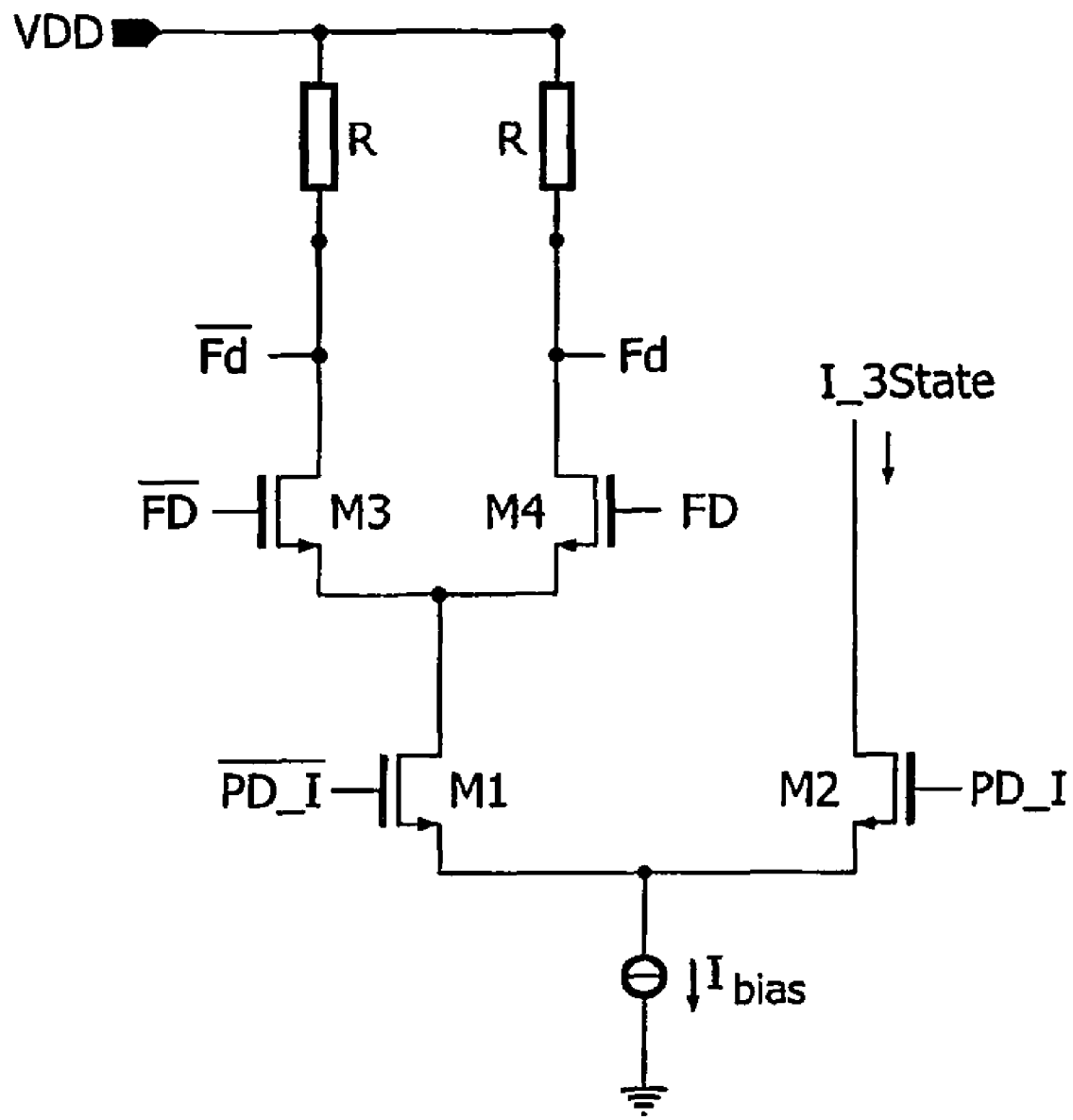
Figure 22:
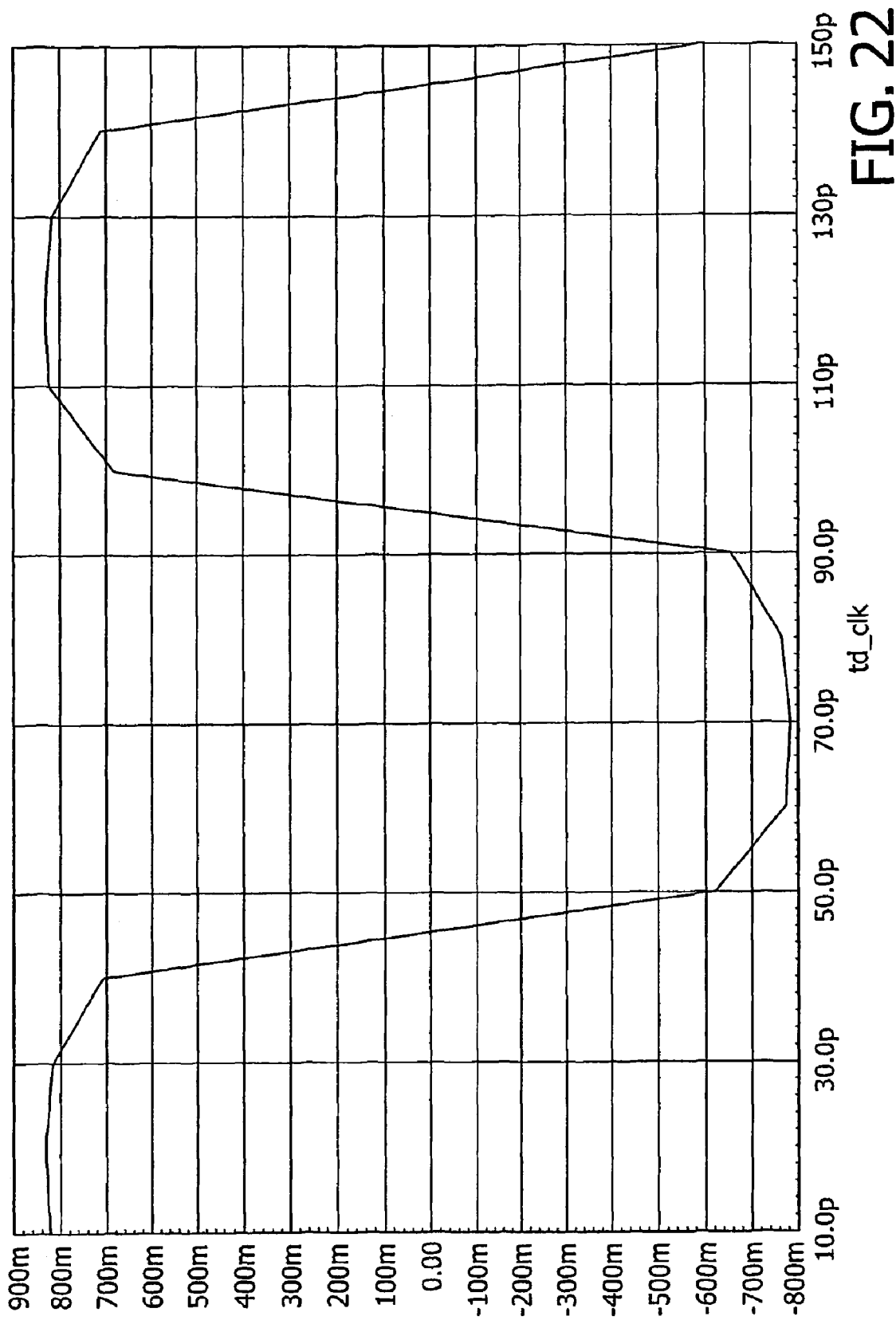
Figure 23:
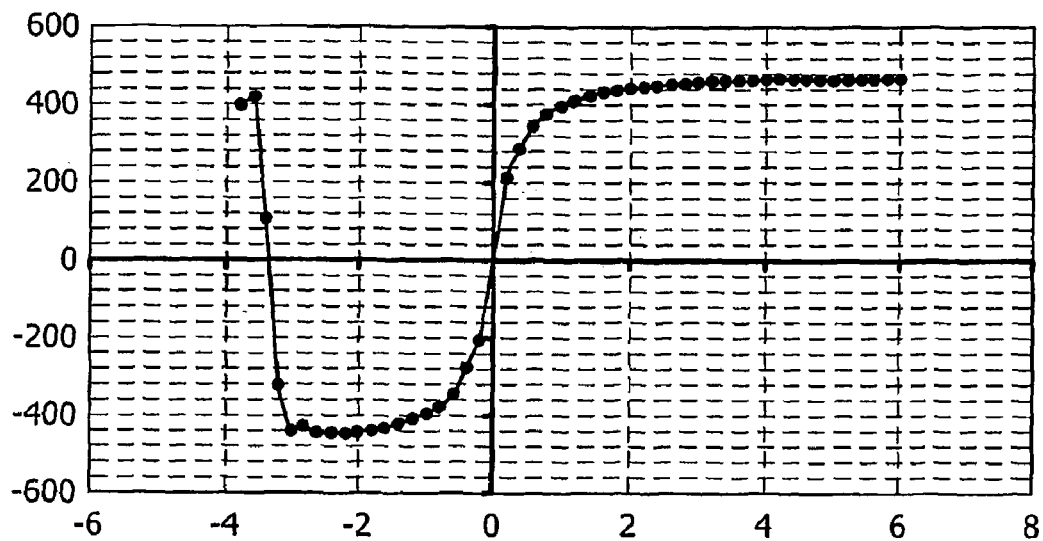
Figure 26:
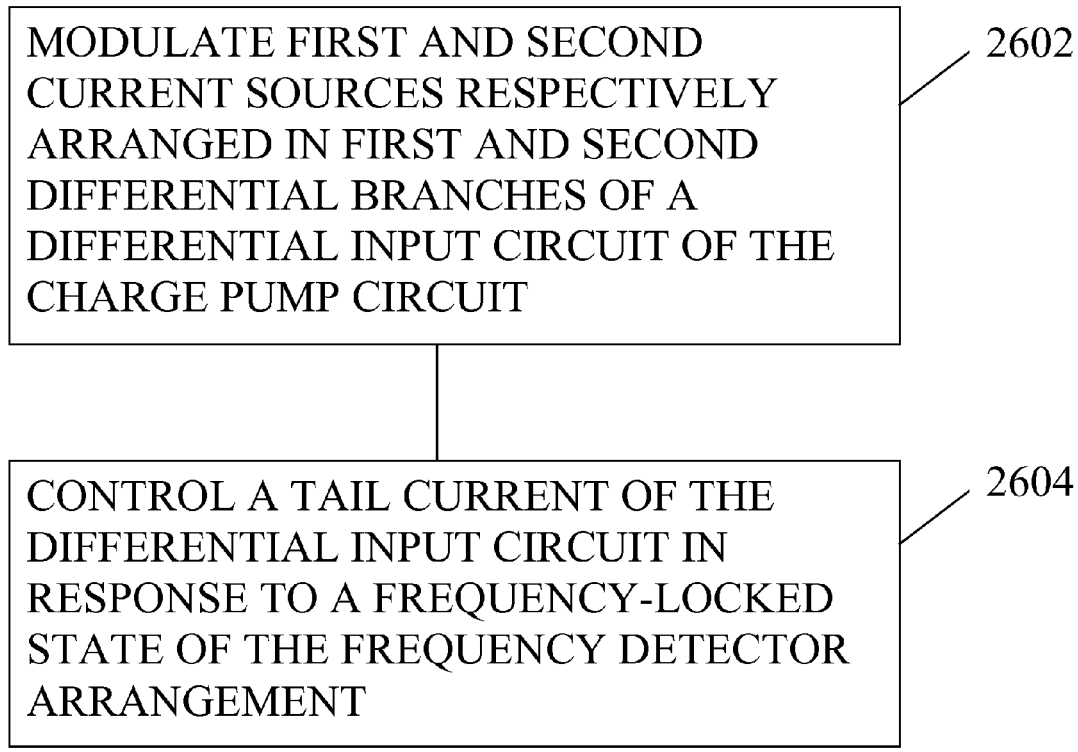

The present invention will now be described in greater detail based on preferred embodiments with reference to the accompanying drawings, in which:

FIG. 1 shows a schematic block diagram of an optical transceiver in which the present invention can be implemented, FIG. 2 shows a digital implementation of a quadricorrelator on which the detector arrangement according to the preferred embodiments is based, FIG. 3 shows a frequency detector arrangement with combined charge pump circuit according to the first preferred embodiment, FIGS. 4A and 4B show waveforms for a double-edge latch-multiplexer configuration for an early clock signal and a late clock signal, respectively, FIG. 5 shows a schematic block diagram for generating two quadrature signals at full rate, FIG. 6 shows a vector representation of an equilibrium position of I and Q vectors in a phase-locked state, FIG. 7 shows vector diagrams for visualizing a frequency detection algorithm according to the preferred embodiments, FIG. 8 shows a D latch circuit in Source Coupled Logic, FIG. 9 shows a multiplexer circuit in Source Coupled Logic, FIG. 10 shows a schematic block diagram indicating the principle of a differential charge pump circuit according to the first preferred embodiment, FIG. 11 shows a schematic block diagram indicating a common-mode rejection principle, which can be used in the charge pump circuit according to the preferred embodiments, FIG. 12 shows a schematic circuit diagram of an implementation of the differential charge pump circuit according to the preferred embodiments, FIG. 13 shows a schematic circuit diagram of a common-mode sense circuit, which can be used in the differential charge pump circuit according to the preferred embodiments, FIG. 14 shows a schematic circuit diagram of a differential charge pump circuit with a common-mode circuit according to the preferred embodiments, FIG. 15 shows a schematic circuit diagram of a charge pump circuit with a tri-state control circuit according to the preferred embodiments, FIG. 16 shows a schematic block diagram of a detector arrangement with a charge pump circuit according to a second preferred embodiment, FIG. 17 shows a schematic circuit diagram of an amplifier circuit with level shift function according to the second preferred embodiment, FIGS. 18A and 18B show respective schematic circuit diagrams of equivalent circuits of a feedback amplifier and a feed forward amplifier of the amplifier circuit of FIG. 17, FIGS. 19A and 19B show schematic circuit diagrams of level shifter circuits for the in-phase arm and the quadrature arm of the second preferred embodiment, FIG. 20 shows a waveform diagram indicating phase detection characteristics of the second preferred embodiment, FIG. 21 shows a schematic circuit diagram of a tri-state circuit of the preferred embodiments, FIG. 22 shows a waveform diagram indicating a phase detector characteristic according to the preferred embodiments, FIG. 23 shows a waveform diagram indicating a frequency detector characteristic of the second preferred embodiment, FIG. 24 shows a schematic block diagram of a known clock extraction and data regeneration circuit, FIG. 25 shows a schematic block diagram of a known clock extraction and data regeneration circuit with two loops and autonomous frequency locking, and FIG. 26 is a process flow diagram of a method of controlling a charge pump circuit used in a frequency detection arrangement in accordance with an embodiment of the invention.

The preferred embodiments will now be described on the basis of a full-rate phase-frequency detector based on a quadricorrelator circuit.

Frequency discriminators based on quadricorrelator circuits are described for example in H. Ransijn and P. O'Connor, "A PLL-based 2.5-Gb/s GaAs clock and data regenerator IC." IEEE J. Solid-State Circuits, vol. 26(10), pp. 1345-1353, October 1991, R. R. Cordell et al. "A 50 MHz phase and frequency-locked loop." IEEE J. Solid-State Circuits, vol. 14(6), pp. 1345-1353, October 1991, and B. Razavi and J. Sung, "A 2.5 Gb/s 15-mW BiCMOS Clock Recovery Circuit", Symposium on VLSI Circ. Dig. Of Tech. Papers, pp. 83-85, 1995. Furthermore, an analog implementation of a quadricorrelator concept based on sample and hold circuits has been described in A. Pottbacker et al., "A 8 Gb/s Si bipolar phase and frequency detector IC for clock extraction", ISSCC Dig. Tech. Papers, pp. 162-163, San Francisco, Calif. February 1992.

According to the preferred embodiments of the present invention, a digital detector arrangement based on a digital implementation of the quadricorrelator concept is presented.

FIG. 2 shows a schematic circuit diagram of a digital implementation of the quadricorrelator, on which the preferred embodiments are based. This digital implementation comprises three latch-multiplexer configurations consisting of two D-latches and one multiplexer. Each latch-multiplexer configuration corresponds in function to a double-edge flip-flop circuit and could be replaced by such a flip-flop circuit. This double-edge flip-flop circuit is clocked on both transitions of the input data signal DATA. Two full-speed clock signals CKI and CKQ are in quadrature with each other, and thus can be regarded as an in phase clock component CKI and a quadrature clock component CKQ. The term "full-speed" indicates that one period of the clock signal corresponds to the bit length Tb of the input data signal.

The double-edge flip-flop function acts to sample both clock components CKI and CKQ at transitions of the input data signal, providing two quadrature signals PT_Q and PT_I. The output of the multiplexer MUX will thus be updated only at transitions of the input data signal DATA. Before the next data transition arrives, the output of the multiplexer MUX is kept on the previous value. The phase difference between the input data signal DATA and the clock components CKQ and CKI, respectively, is transformed into a positive or negative quantized or binary signal. When this signal is positive, the clock will increase its phase, and when the signal is negative, the clock will decrease its phase.

In the following, for the sake of simplicity, the two quadrature outputs PD_Q and PD_I are denoted as Q and I, respectively. The third latch-multiplexer configuration functions as a third double-edge flip-flop circuit which samples the output signal or vector Q at the transitions of the output signal or vector I. Thus, the frequency error can be obtained at the output of the third latch-multiplexer configuration. This frequency error is also obtained in a quantized or binary form. Therefore, in a phase locked situation, the output frequency error signal ripples between a positive and negative value with a period corresponding to the bit period Tb of the input data signal and a 50% duty cycle.

It is noted that in the third latch-multiplexer configuration comprising the D-latches L5 and L6, a sign inversion is introduced at the output of the upper D-latch L5, which leads to an inversion of the Q vector at positive values of the I vector. This inversion is needed to implement a differentiator function of the analog quadricorrelator which gives positive values on the rising edge and negative values on the falling edge.

The equilibrium or balanced position for the vectors I and Q can be represented with the rotating wheel analogy in a vector diagram, as shown in FIG. 6. According to FIG. 6, the vector I is positive, stable and equal to "+1" whilst the vector Q bounces from the positive to the negative quadrant in a periodic fashion due to the bang-bang characteristic of the circuit. This frequency error generation can be explained by using the rotating wheel analogy as follows. When the clock is too slow, the pair of the two quadrature vectors I and Q rotates counter-clockwise with an angular frequency equal to the frequency difference $\Delta\omega$ and the derivative of the vector I falls before the vector Q, generating an error signal. On the other hand, when the clock is too fast, the pair of two quadrature vectors I and Q rotates clockwise with an angular frequency equal to the frequency difference $\Delta\omega$ and the derivative of the vector I falls before the vector Q with 180° phase difference, generating an error signal.

FIG. 3 shows a schematic block diagram of a detector arrangement with charge pump circuit according to the first preferred embodiment. This detector arrangement is based on the bang-bang principle and works at full-rate with the two clock components CKQ and CKI in quadrature with each other. The random transitions on the input data signal DATA are used to sample the clock to generate a phase error signal. Two quadrature phase error signals PD_I and PD_Q are generated at the same time. The two quadrature phase error signals PD_Q and PD_I are consequently used in order to produce a frequency error signal FD. Once the frequency locked state is acquired, the frequency detector gives a zero DC voltage at the output so that the subsequent VCO keeps the frequency information. Due to its simplicity, this principle can be used in high-speed clock and data recovery, as for example in optical communication systems.

In particular, the detector arrangement in FIG. 3 comprises two bang-bang phase detectors, which output signals are in quadrature relation with each other, and are respectively called PD_Q and PD_I.

In case of autonomous locking, the frequency information needs to be recovered from the transitions of the input data signal DATA. In this case, a full-rate frequency detector with tri-state output or a half-rate frequency detector with tri-state output can be used. In both cases, an extra output is obtained as a bang-bang phase detector output. FIG. 3 depicts the full-rate frequency detector which has two quadrature clock input signals CKQ and CKI at full speed, i.e. $f_{clk}=1/Tbit$, which means that the clock frequency $f_{clk}$ corresponds to the maximum bit rate of the input data signal DATA.

In order to understand the operation of the phase-frequency detector arrangement of FIG. 3, the latch-multiplexer combination having a double-edge triggered flip-flop function is described in more detail. The latch circuits L1 to L4 sample the respective clock signal with the input data signal DATA on both up and down going edges of the input data signal DATA. The upper latch circuit L1, L3 is transparent to the respective clock input when the input data signal DATA is high. The lower circuit L2, L4 is transparent to the respective clock input when the input data signal DATA is low. The speed of operation of this double-edge latch-multiplexer configuration is high since the two upper and lower latch or sampling circuits work interleaved. When the upper latch circuit samples the clock signal, the lower latch circuit delivers its output, and when the lower latch circuit samples the clock signal, the upper latch circuit delivers its output. The output of the multiplexers MUX will be updated only at data transitions, while between the data transitions the output value is kept constant. As a consequence, the double-edge triggered latch-multiplexer configuration give sample versions of the clock signal. At data transitions, the output of the latch-multiplexer configurations will follow the clock transitions. Therefore, the double-edge triggered latch-multiplexer configuration can be used as a phase detector, wherein the phase difference between the input data signal DATA and the clock components CKQ and CKI is transformed into respective quantized or binary signals.

FIGS. 4A and 4B show waveforms relating to the double-edge latch-multiplexer configuration, wherein FIG. 4A relates to the case where the clock signal is early, i.e. it advances the input data signal, and FIG. 4B relates to the case where the clock signal is late, i.e. follows the input data signal. If the respective output voltage V_OUT of the latch-multiplexer configuration is positive, the respective clock signal is early and needs to decrease its phase. If the respective output voltage V_OUT is negative, the clock signal is late and needs to increase its phase. As can be gathered from FIGS. 4A and 4B, each of the latch-multiplexer configuration has a bang-bang characteristic, i.e. the output voltage V_OUT is either positive or negative depending on the fact whether the respect clock signal is early or late.

As a frequency information is required from the transitions of the input data signal DATA, more clock phases at full-rate are needed, such that two double-edge latch-multiplexer configurations are used to generate the two quadrature phase error signals PD_Q and PD_I.

FIG. 5 shows such a double-edge latch-multiplexer configuration for generating two quadrature signals Vi and Vq based on two clock signals or clock components CKI and CKQ in quadrature, which are sampled by the input data signal DATA. From these two quadrate phase error signals Vi and Vq, the frequency error signal can be extracted as follows.

The data transitions sample the two quadrature clock components CKI and CKQ at full speed. In FIG. 3, the phase detection outputs PD_Q and PD_I correspond to the outputs of two phase detectors and are in quadrature with each others, which means they have a phase difference of 90°. In the following, again, the two quadrature phase outputs PD_Q and PD_I are denoted as Q and I outputs, respectively.

As already explained, FIG. 6 shows the equilibrium position for the corresponding vectors I and Q in the rotating wheel analogy. In the locked phase state, the vector I is positive, stable and equal to "+1" whilst the vector Q bounces from the positive to a negative quadrant in a periodic fashion. By monitoring the positive to negative transitions of the vector I, the frequency error can be obtained based on the following algorithm:

1. When the vector I has a negative to positive transition, which means it changes from a negative to a positive quadrant in the vector diagram, the frequency must be kept by generating a zero signal at the output of the frequency detector.
2. When the vector I has a negative to positive transition, which means that it changes from a negative quadrant to a positive quadrant, for negative vectors Q, the frequency must be kept by generating a zero signal at the output of the frequency detector.
3. When the vector I has a positive to negative transition and the vector Q is positive, the frequency has to be increased by generating a frequency error signal FD=+1.
4. When the vector I has a positive to negative transition and the vector Q is negative, the frequency has to be decreased by generating a frequency error signal FD=−1.

FIG. 7 shows a visualization of this algorithm based on different vector diagrams indicating the above four cases. In operation, each of the four possible cases will converge towards the equilibrium position shown in FIG. 6. In the following table, the four cases or situations are presented, which can be used to construct the logic for the frequency detector:

| PD_I (I vector) | PD_Q (Q vector) | FD |
|---|---|---|
| −/+ | −1 | 0 |
| −/+ | 1 | 0 |
| +/− | −1 | −1 |
| +/− | 1 | +1 |

As shown in FIG. 3, the vector I is being used to clock a latch circuit L5 which samples the vector Q (which corresponds to the phase detection output PD_Q). Furthermore, as depicted in FIG. 3, the other phase detection output PD_I and its inverse output are sign-inverted (SI) and supplied to respective transistors M1 and M2 of a differential tri-state control circuit TS which controls a charge pump circuit 82. Based on the value of the vector I (phase detection output PD_I), the tail current $I_{bias}$ of the differential control circuit flows through the sources of another differential pair M3, M4 or can be dumped or forced to a predetermined current I_3State. The vectors Q and I correspond to the quantized phase error wherein the vector I is used to sample the vector Q with the latch circuit L5. When the vector I is positive, the latch circuit L5 is transparent to the vector Q, but the tri-state control circuit TS is not transparent to the output signal FD of the latch L5. This means that no frequency error will be generated when the vector I is positive. Only when the vector I changes from positive to negative values, the tri-state control circuit TS starts to be transparent to the output of the latch circuit L5 and at this moment the latch circuit L5 latches the last sampled value, i.e. the latest value of the vector Q. In equilibrium, when the vector I is positive and "+1", the other differential pair M3, M4 is not active any longer and the differential output of the frequency detector VFD is zero. The dump current I_3State from the transistor M2 can be used to switch off the charge pump circuit 82.

An advantage of this implementation resides in the possibility of pull-in with large frequency errors leading to an improved frequency detector arrangement due to its simplicity and frequency error detection capabilities. However, due to the fact that the phase detector arrangement generates a quantized version of the phase error extra ripple is generated in the phase-locked state at the fine input of the VCO. Nevertheless, this extra ripple can be reasonable small. The amount depends on the amount of data transitions per time unit. More data transitions mean that the frequency detector has more information and thus the VCO frequency will not drift too far away from the locked frequency. However, using a tri-state charge pump circuit can alleviate this extra ripple, as explained later.

In the following, practical implementations of the latch circuits L1 to L5 and the multiplexer circuits MUX are described in more detail.

FIG. 8 shows a schematic circuit diagram of a D-latch circuit in Source Coupled Logic (SCL) which can be used as latch circuits L1 to L5. This D-latch circuit is based on a CMOS (Complementary Metal Oxide Semiconductor) Current Mode Logic (CML) which is a CMOS implementation of the bipolar Emitter Coupled Logic (ECL). Similar to ECL, signal swings can be made small by this technology. A bias current $I_{bias}$ flows in the sources of the CMOS transistors M5, M6 or M3, M4, in dependence on the polarity of the clock signal CLK. Furthermore, the polarity of the data signal D selects the current path to the output Q when the data signal D is negative, or to the output $\overline{Q}$ when the data signal D is positive. Thereby, the function of the latch circuits L1 to L5 can be obtained.

FIG. 9 shows an implementation example for the multiplexer circuit MUX in SCL. Similar to FIG. 8, a bias current $I_{bias}$ flows in the sources of the CMOS transistors M5, M6 or M3, M4, independence on the polarity of a selection signal S. The polarity is of the signals Ch1, Ch2 select the paths for the current. When the selection signal S is positive, the bias current flows in the source of the CMOS transistors M3 and M4. When the selection signal S is positive and the channel signal Ch1 is positive, then the output Q is positive, and the bias current will flow through a resistor R1 and the transistor M3. When the selection signal S is positive and the channel signal Ch1 is negative, then the output Q is negative, and the bias current will flow through another resistor R0 and the transistor M4. Thus, when the selection signal S is positive, the multiplexer circuit is transparent to the channel signal Ch1, which means that the output of the multiplexer is equal to the channel signal Ch1. Similarly, when the selection signal S is negative, the bias current flows in the source of the transistors M5 and M6. Then, the multiplexer circuit is transparent to the second channel signal Ch2, which means that the output of the multiplexer circuit is equal to the channel signal Ch2.

In the following, a tri-state charge pump circuit is described in greater detail, which provides the advantage of reduced ripple in the equilibrium state. In particular, this tri-state charge pump circuit can be used as the charge pump circuit 82 in FIG. 3.

Phase or frequency comparison at high speed requires fast charge pump circuits for filtering the spurious signals at the output of the phase/frequency detector arrangement. In clock and data recovery, the comparison between the transitions of the input data signal DATA and the clock transitions is done at full speed since frequency dividers cannot be used due to the random character of the input data signal DATA.

Therefore, a differential charge pump circuit is proposed which can be used for high-speed phase/frequency detectors. A differential charge pump has the advantage of being less sensitive to common-mode noise from the power supply lines and substrate. In general, a charge pump circuit is a current source which charges/discharges a filter inside the frequency and phase loops depicted in FIG. 25. The input of the charge pump circuit can be a fast series of pulses, so that it has to be ensured that a fast switching between both states and a linear representation of the phase error in the form of a charge in the capacitor of the loop filter is obtained. The simplest implementation of this principle is a circuit which has two digital input lines to drive two switches which provide a constant charging or discharging current to a capacitor. Then, the output voltage at the capacitor corresponds to the integral of the binary signals which drive the respective switches. When both switches are open, the voltage on the capacitor remains the same. Maintaining the voltage on the capacitor is equivalent to keeping the same frequency at the output of the VCO.

However, as mentioned above, differential circuits have a better immunity towards supply and substrate noise due to the strong rejection of the common mode noise. Also, the practical implementation of the capacitor in the single ended solution gives extra parasitic capacitances in parallel with the capacitor of the filter. In the differential mode, however, the capacitor of the filter can be laid out such that the parasitic capacitance obtained by circuit lines and circuit elements is not a part of the differential filter.

FIG. 10 shows a schematic block diagram of a differential charge pump circuit as proposed according to the first preferred embodiment. The basic idea is to have control on the charge pump circuit in such a manner that it will be active only when the frequency error signal FD at the output of the frequency detector needs to be processed. This can be realized by controlling the tail current of the differential charge pump circuit. The frequency information may be differentially pumped into the output filter of the charge pump circuit.

According to FIG. 10, a differential input signal Δx is adapted to modulate current sources $I_0$ in both branches of the differential circuit. To achieve a double output variation, for each branch, the DC current and the modulation are copied into the upper part of the other branch via two respective current mirror circuits CM having a mirror ratio 1:1.

This charge pump circuit leads to the advantages that the double output current is supplied to a filter F, compared to the traditional differential charge pump, and an on-off control can be achieved by controlling the tail current of the charge pump circuit.

Furthermore, rejection of common-mode signals from the supply lines and substrate is improved due to differential implementation. As the common-mode level influences the oscillation frequency of the subsequent VCO, enhanced control of the common-mode level of the charge pump circuit may be necessary. To achieve this, a common-mode rejection circuit can be used to control the common-mode level at the output of the charge pump circuit, so that the output common mode will be constant irrespective of changes in temperature and supply.

FIG. 11 shows an improved implementation example of the charge pump circuit with an additional common-mode rejection circuit. In particular, the common mode at the output is rejected with a negative feedback circuit C which compares the common-mode voltage at the output with a band gap-referenced voltage $V_{CM}$. This common-mode rejection circuit C adds/subtracts from both current sources the same current as obtained by the comparison.

FIG. 12 shows a transistor level implementation of the charge pump circuit shown in FIG. 10. The input currents $I_0+\Delta x$ and $I_0-\Delta x$ comprise a DC current $I_0$ and a modulation pulsed current Δx. These input currents are cross-mirrored in the current-mirror transistors M5 and M8, respectively. In this way, the signal Δx is doubled in the filter F which consists of two serial capacitors 2C. Signal current 2Δx flows in the output filter F, where the capacitor C is represented as the series connection of the two capacitors 2C. The plate of the capacitor 2C with largest parasitics is connected to the common-mode of the two capacitors. In this way, the parasitic capacitances are not part of the filter.

FIG. 13 shows an implementation of a common-mode sense circuit. The common mode at the output of the charge pump circuit, e.g. output nodes OUT+ and OUT− in FIG. 12, can be measured with the transistors M3 and M4 in FIG. 13, which work as controlled resistors in a triode regime. The DC current $4I_0$ is forced to a source degenerated mirror circuit consisting of the transistors M1 and M2. The controlled transistors M5 and M6 have their gates connected to the band gap referenced voltage $V_{CM}$. Thus, the mirror ratio at the output of the transistor M2 depends on the ratio of the MOS resistors present on the sources of the transistors M1 and M2. The resistance of the MOS combination depends on the common-mode voltage as long as the band gap referenced voltage $V_{CM}$ is larger than the threshold voltage of the transistors. By substracting the DC current at the output of the transistor M2 and M3, only the error signal±ΔI will be transmitted at the output of the sense circuit. The error signal is thus a measure of the difference between the common-mode voltage at the output and the band gap referenced voltage $V_{CM}$. In the equilibrium state, the sum of the voltages at the nodes or terminals OUT− and OUT+ is double the value of the band gap referenced voltage $V_{CM}$.

FIG. 14 shows a transistor level schematic circuit diagram of a charge pump circuit with common-mode control as explained above. The particularity of this circuit consists of the fact that the signal is mirrored together with the common-mode error signal in order to correct for the $I_0$ DC common-mode current. As mentioned above, the charge pump circuit can be used in the coarse loop for frequency correction. When the locked state has been reached, this charge pump circuit will shut down completely so that there will be no jitter contribution from the coarse loop shown in FIG. 25. This is achieved by controlling the tail current of the charge pump circuit using the intermediate tri-state control circuit TS of FIG. 3. However, in order to use the tri-state control circuit TS to switch the charge pump circuit, an interface circuit is needed between the dump current I_3State and the tail current of the charge pump circuit 82.

FIG. 15 shows a schematic circuit diagram of the charge pump circuit according to FIG. 14 with a corresponding interface to the dump current I_3State of FIG. 3.

The dump current I_3State is present or active when the frequency is in the locked state, i.e. the phase detection signal PD_I has the value "+1". In this case, the biasing current $4I_0$ flows through the transistor M3*. The transistor M4* is blocked. Thus, no current is copied to the tail of the charge pump circuit and the charge pump circuit is switched off. As soon as a frequency error occurs and the phase detection signal PD_I changes to the value "−1", the dump current I_3 State is switched to zero by the tri-state control circuit in FIG. 3, and the biasing current $4I_0$ flows through the transistor M4*. Then, the transistor M3* is blocked. The same biasing current $4I_0$ is copied to the tail of the charge pump circuit is switched on.

As an example, the value of the band gap referenced voltage $V_{CM}$ may be set to about 1.25V, based on the output common mode of the charge pump circuit.

As mentioned above, the common mode at the output of the charge pump circuit is rejected with a negative feedback circuit which compares the common-mode voltage at the output with this band gap referenced voltage $V_{CM}$.

FIG. 16 shows a detector arrangement with charge pump circuit according to a second preferred embodiment.

In a second preferred embodiment, amplifier circuits 84 have been added to the first preferred embodiment of FIG. 3 to amplify the signals from the double-edge latch-multiplexer configurations. Furthermore, level shift circuits 86 have been introduced to adapt the common-mode levels at the data inputs D and clocked inputs CK of the latch circuit L5. Thereby, improved in/out compatibility between the building blocks can be achieved, to thereby improve signal quality and adapt signal swing and/or common mode levels to suit the need of the next circuit stage.

It is difficult to get the required amplification at the output of a bang-bang phase detector constructed, for example, with CMOS18 technology. The latch circuits L1 to L4 do not recover fully the amplitude of input signals. The attenuated phase detection outputs PD_I and PD_Q will thus lead to difficulties in processing the signals in the following stages. The latch circuit L5 is used to sample the quadrature phase detection output PD_Q the in-phase detection output PD_I. As the swing or level of the in-phase detection output PD_I is not big enough, the two transistors MI and M2 of the tri-state control circuit in FIG. 3 and FIG. 16 may not be able to get fully imbalanced. Therefore, in order to achieve enough gain, the additional amplifier circuit 84 is needed between the in-phase detection output PD_I and the latch circuit L5. A similar amplifier 84 is added between the quadrature detection output PD_Q and the latch circuit L5, not only to achieve a bigger swing but also a better delay matching.

FIG. 17 shows a schematic circuit diagram of the amplifier 84. In particular, the amplifier 84 consists of a feedback amplifier with resistors R1 and R2 and a differential transistor pair M2 and M3. Furthermore, a feedforward amplifier consisting of the resistor R1, a differential transistor pair M1 and M4, a load R and transistors M6 and M7 is provided. The feedforward amplifier amplifies the signals at the gates of the transistors M1 and M4, cross-injecting more signal at the output through the transistors M6 and M7. The output current will be delivered by both, the feedforward amplifier and the feedback amplifier.

FIGS. 18A and 18B show equivalent circuits for AC signals of the feedback amplifier and the feedforward amplifier, respectively. The output voltage Vout of the equivalent circuits of the feedback and feedforward amplifiers can be estimated by applying superposition.

The output voltage Vout1 of the feedback amplifier of FIG. 18A can be approximately calculated as follows:

$$V_{out1} \approx -\frac{R2}{R1} \cdot \frac{V_{id}}{2}$$

wherein $V_{id}$ indicates the differential input voltage.

Based on the transconductance gm of the transistors, the output voltage Vout2 of the feedforward amplifier circuit of FIG. 18B can be approximately calculated as follows:

$$V_{out2} \approx -\frac{V_{id}}{2} \cdot \left[\left(\frac{R_L}{2R_1\left(1 + \frac{1}{g_m R}\right)}\right)\right]$$

According to the superposition principle the output voltage Vout of FIG. 17 corresponds to the sum of Vout1 and Vout2. As the output voltage in FIG. 17 is obtained at a single side with respect to ground, the output voltage of the amplifier circuit corresponds to half of the differential output voltage $V_{out}$ which can be approximately calculated as follows:

Under the assumption $g_m$ and R>>1, the voltage gain of the amplifier circuit 84 of FIG. 17 can be expressed as follows:

$$V_{out} \approx -\frac{V_{id}}{2} \cdot \left[\left(\frac{R_2}{R_1}\right) + \frac{R_L}{2R_1\left(1 + \frac{1}{g_m R}\right)}\right]$$

$$A_v \approx -\frac{R_2}{R_1} - \frac{R_L}{2R_1}$$

By adding the feedback amplifier portion, the output impedance is reduced, and the output of the amplifier fits higher capacitance loads. In the present case, this capacitance load is generated by the gate-source capacitances of the next stage. Furthermore, due to the feedback resistor network, the gain can be better controlled depending on the resistor ratios.

Considering the structure of the frequency detector in FIG. 16, the common mode of both phase detection outputs PD_I and PD_Q from the double-edge latch-multiplexer configurations can be estimated to about 1.6 V. Thus if the double-edge output is directly connected the level shift circuits 86, the transistors M1 and M2 of the tri-state control circuit would be pushed into their linear region. In order to get a correct input common mode for the level shift circuits 86, the output common mode of the double-edge latch-multiplexer configuration should be shifted to about 1.2 V. Hence, the amplifier circuit 84 should be designed to achieve linear amplification of the output of the double-edge latch-multiplexer configuration and to also shift the common mode level to about 1.2 V needed by the level shift circuits 86. Thereby, the gain can be improved to achieve enough swing so that full imbalance can be ensured at the tri-state control circuit TS. Furthermore, a common mode level shift necessary for the next stage, i.e. the level shift circuit 86, can be achieved.

FIGS. 19A and 19B show schematic circuit diagrams of the level shift circuits 86 on the PD_I arm and the PD_Q arm, respectively. At the latch circuit L5, the common mode of the clock signal should be about 1.1 V. In order to get a suitable common mode for the latch circuit L5 and also for the tri-state control circuit TS, the level shift circuits 86 are introduced. The lower shift circuit 86 is needed in the PD_I arm to achieve a suitable clock common mode for the latch circuit L5. The level shift circuit 86 in the upper PD_Q arm is introduced to keep a good matching. In order to generate two different common-mode voltages at the output, the two level shift circuits 86 are made slightly different. As can be gathered from FIGS. 19A and 19B, the common mode in the PD_I arm is shifted lower than the common mode in the PD_Q arm. This is obvious due to the additional resistor R2 in FIG. 19A. Furthermore, the level shift circuits of FIGS. 19A and 19B introduce a significant gain such that the swing of the phase detection outputs PD_I and PD_Q is enhanced.

FIG. 20 shows a waveform diagram indicating respective signals at the input of the amplifier circuit 84, at the input of the level shift circuit 86 and at the input of the latch circuit L5. As can be gathered from FIG. 20, the swings of the phase detection outputs PD_I and PD_Q are firstly augmented by the amplifier circuit 84 and then again increased by the level shifter circuits 86. Due to the modifications shown in FIGS. 19A and 19B, the two level shifter circuits 86 have different common mode levels at the output but they have exactly the same gain to the differential arrangement.

FIG. 21 shows a circuit diagram of the tri-state control circuit TS of FIGS. 3 and 16. When the frequency detection output of the latch circuit L5 is in a frequency-locked stage, the quadrature phase detection output PD_Q will be active with a 50% duty cycle, this signal is seen as a frequency error. Therefore, the tri-state control circuit TS is introduced to keep the coarse frequency detection loop completely suppressed so that there will be no contribution from the coarse loop. The tri-state control circuit is controlled by the in-phase detection output PD_I to suppress operation of the charge pump circuit 82 when frequency is in the locked state. In particular, in the frequency-locked state, the PD_I signal is positive and the transistors M1 and M2 are fully imbalanced. All bias current flows through the transistor M2 and corresponds to the dump current I_3State. Thus the I_3State current or signal is used to suppress the charge pump as explained earlier. This suppression of operation of the charge pump circuit 82 can be based on a suppression of its tail current.

FIG. 22 shows a phase detector characteristic of the detector arrangement as a simulation result for an input data rate of 10 Gb/s and a clock frequency of 10 GHz in the locked state. As can be seen in FIG. 22, the phase detection output is not zero due to the intrinsic error. From the simulation result in FIG. 22 it can be seen that the phase detector arrangement has a clear bang-bang characteristic and works as expected with a periodic characteristic.

FIG. 23 shows a phase detection characteristic of the detector arrangement with an input clock signal of 10 GHz and an input data bit rate changing from 6 Gb/s to 16 Gb/s. Thus, in FIG. 23, the horizontal axis corresponds to the data bit rate, while in FIG. 22 the horizontal axis indicates the time axis. The difference between the clock frequency and the bit rate are interpreted frequency difference between −4 GHz and +6 GHz.

As can be gathered from FIG. 23, the phase detector arrangement can correctly react to clock-data frequency differences between ±3 GHz. Thus, the working frequency range of the phase detector arrangement should be limited to a range between −3.5 GHz and +3.5 GHz. However, at the positive side, the operating range continues monotonically up to about 6 GHz.

FIG. 26 is a process flow diagram of a method of controlling a charge pump circuit used in a frequency detection arrangement in accordance with an embodiment of the invention. At block 2602, first and second current sources respectively arranged in first and second differential branches of a differential input circuit of the charge pump circuit are modulated. At block 2604, a tail current of the differential input circuit is controlled in response to a frequency-locked state of the frequency detector arrangement.

Generally, it can be seen from the above description that the proposed phase-frequency detector arrangement can be used with frequency differences from −3.5 GHz up to +3.5 GHz. The advantage of this implementation resides in the possibility to pull-in large frequency errors. Also, the simplicity of the circuit and relatively low supply power to a low power consumption and low fabrication costs. As an advantage, the frequency detector gives a zero output to the charge pump circuit in the frequency locked state. Thus, the frequency variation is zero and the noise contribution from the frequency detector to the charge pump circuit can be reduced significantly.

It is to be noted that the present invention is not restricted to the above preferred embodiments but can be used in any frequency and/or phase detection arrangement with bang-bang characteristic. The preferred embodiments may thus vary within the scope of the attached claims.

The invention claimed is:

1. A charge pump circuit for use in a frequency detector arrangement, said charge pump circuit comprising:
    a) a differential input circuit having first and second differential branches for carrying first and second modulated currents;
    b) first and second current mirror circuits (CM) respectively provided in said first and second differential branches and arranged to copy the modulated current of one differential branch into the respective other differential branch; and
    c) control means for controlling a tail current of said differential input circuit in response to a frequency-locked state of said frequency detector arrangement.

2. A charge pump circuit according to claim 1, further comprising a common mode rejection means (C) for comparing a common-mode voltage at the output of said charge pump circuit with a reference voltage ($V_{CM}$), and for controlling said first and second current sources based on the comparison result.

3. A charge pump circuit according to claim 1, wherein said control means comprises switching means (M1, M2) for switching said tail current in response to a control signal indicating said frequency-locked state.

4. A method of controlling a charge pump circuit used in a frequency detection arrangement, said method comprising the steps of:

a) modulating first and second current sources respectively arranged in first and second differential branches of a differential input circuit of said charge pump circuit; and b) controlling a tail current of said differential input circuit in response to a frequency-locked state of said frequency detector arrangement.

* * * * *